United States Patent
Ahn et al.

(10) Patent No.: US 7,719,065 B2
(45) Date of Patent: May 18, 2010

(54) RUTHENIUM LAYER FOR A DIELECTRIC LAYER CONTAINING A LANTHANIDE OXIDE

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 378 days.

(21) Appl. No.: 11/215,412

(22) Filed: Aug. 29, 2005

(65) Prior Publication Data

US 2006/0043492 A1    Mar. 2, 2006

Related U.S. Application Data

(62) Division of application No. 10/926,812, filed on Aug. 26, 2004, now Pat. No. 7,081,421.

(51) Int. Cl.
    *H01L 29/76* (2006.01)
(52) U.S. Cl. .................. 257/411; 257/410; 257/407; 257/E29.132; 257/E29.138; 257/E29.162
(58) Field of Classification Search ........... 257/407, 257/410–412, E29.132, E29.139, E29.158, 257/E29.16, E29.162
    See application file for complete search history.

(56) References Cited

U.S. PATENT DOCUMENTS

| | | | |
|---|---|---|---|
| 3,488,633 A | 1/1970 | King et al. |
| 4,058,430 A | 11/1977 | Suntola et al. |
| 4,413,022 A | 11/1983 | Suntola et al. |
| 5,049,516 A | 9/1991 | Arima |
| 5,055,319 A | 10/1991 | Bunshah et al. |
| 5,426,603 A | 6/1995 | Nakamura et al. |
| 5,439,524 A | 8/1995 | Cain et al. |
| 5,445,699 A | 8/1995 | Kamikawa et al. |
| 5,496,597 A | 3/1996 | Soininen et al. |
| 5,562,952 A | 10/1996 | Nakahigashi et al. |
| 5,572,052 A | 11/1996 | Kashihara et al. |
| 5,674,563 A | 10/1997 | Tarui et al. |
| 5,698,022 A | 12/1997 | Glassman et al. |
| 5,739,524 A | 4/1998 | Fally |

(Continued)

FOREIGN PATENT DOCUMENTS

EP    1096042    5/2001

(Continued)

OTHER PUBLICATIONS

Ahn, Kie Y., et al., "Lanthanide Yttrium Aluminum Oxide Dielectric Films", U.S. Appl. No. 11/297,567, filed Dec. 8, 2005.

(Continued)

*Primary Examiner*—Matthew E Warren
(74) *Attorney, Agent, or Firm*—Schwegman, Lundberg & Woessner, P.A.

(57) ABSTRACT

A ruthenium layer for a dielectric layer containing a lanthanide layer and a method of fabricating such a combination of ruthenium layer and dielectric layer produce a reliable structure for use in a variety of electronic devices. A ruthenium or a conductive ruthenium oxide layer may be formed on the lanthanide oxide dielectric layer.

20 Claims, 5 Drawing Sheets

U.S. PATENT DOCUMENTS

| | | | |
|---|---|---|---|
| 5,751,021 A | 5/1998 | Teraguchi |
| 5,792,269 A | 8/1998 | Deacon et al. |
| 5,801,105 A | 9/1998 | Yano et al. |
| 5,810,923 A | 9/1998 | Yano et al. |
| 5,827,571 A | 10/1998 | Lee et al. |
| 5,828,080 A | 10/1998 | Yano et al. |
| 5,840,897 A | 11/1998 | Kirlin et al. |
| 5,916,365 A | 6/1999 | Sherman |
| 5,958,140 A | 9/1999 | Arami et al. |
| 5,981,350 A | 11/1999 | Geusic et al. |
| 6,010,969 A | 1/2000 | Vaarstra |
| 6,019,848 A | 2/2000 | Frankel et al. |
| 6,020,024 A | 2/2000 | Maiti et al. |
| 6,020,243 A | 2/2000 | Wallace et al. |
| 6,025,225 A | 2/2000 | Forbes et al. |
| 6,025,627 A | 2/2000 | Forbes et al. |
| 6,027,961 A | 2/2000 | Maiti et al. |
| 6,059,885 A | 5/2000 | Ohashi et al. |
| 6,060,755 A | 5/2000 | Ma et al. |
| 6,090,636 A | 7/2000 | Geusic et al. |
| 6,110,529 A | 8/2000 | Gardiner et al. |
| 6,125,062 A | 9/2000 | Ahn et al. |
| 6,134,175 A | 10/2000 | Forbes et al. |
| 6,141,260 A | 10/2000 | Ahn et al. |
| 6,150,188 A | 11/2000 | Geusic et al. |
| 6,173,379 B1 | 1/2001 | Poplingher et al. |
| 6,174,809 B1 | 1/2001 | Kang et al. |
| 6,191,448 B1 | 2/2001 | Forbes et al. |
| 6,198,168 B1 | 3/2001 | Geusic et al. |
| 6,200,893 B1 | 3/2001 | Sneh |
| 6,203,613 B1 | 3/2001 | Gates et al. |
| 6,207,589 B1 | 3/2001 | Ma et al. |
| 6,210,999 B1 | 4/2001 | Gardner et al. |
| 6,211,035 B1 | 4/2001 | Moise et al. |
| 6,217,645 B1 | 4/2001 | Vaartstra |
| 6,225,237 B1 | 5/2001 | Vaartstra |
| 6,273,951 B1 | 8/2001 | Vaartstra |
| 6,274,937 B1 | 8/2001 | Ahn et al. |
| 6,281,042 B1 | 8/2001 | Ahn et al. |
| 6,294,813 B1 | 9/2001 | Forbes et al. |
| 6,297,103 B1 | 10/2001 | Ahn et al. |
| 6,297,539 B1 | 10/2001 | Ma et al. |
| 6,313,035 B1 | 11/2001 | Sandhu et al. |
| 6,313,518 B1 | 11/2001 | Ahn et al. |
| 6,317,357 B1 | 11/2001 | Forbes |
| 6,323,081 B1 | 11/2001 | Marsh |
| 6,323,511 B1 | 11/2001 | Marsh |
| 6,329,286 B1 | 12/2001 | Vaartstra |
| 6,331,465 B1 | 12/2001 | Forbes et al. |
| 6,342,445 B1 | 1/2002 | Marsh |
| 6,347,749 B1 | 2/2002 | Moore et al. |
| 6,350,704 B1 | 2/2002 | Ahn et al. |
| 6,352,591 B1 | 3/2002 | Yieh et al. |
| 6,365,470 B1 | 4/2002 | Maeda |
| 6,368,398 B2 | 4/2002 | Vaartstra |
| 6,380,579 B1 | 4/2002 | Nam et al. |
| 6,381,168 B2 | 4/2002 | Forbes |
| 6,387,712 B1 | 5/2002 | Yano et al. |
| 6,392,257 B1 | 5/2002 | Ramdani et al. |
| 6,395,650 B1 | 5/2002 | Callegari et al. |
| 6,399,979 B1 | 6/2002 | Noble et al. |
| 6,403,414 B2 | 6/2002 | Marsh |
| 6,404,027 B1 | 6/2002 | Hong et al. |
| 6,407,427 B1 | 6/2002 | Oh |
| 6,407,435 B1 | 6/2002 | Ma et al. |
| 6,417,537 B1 | 7/2002 | Yang et al. |
| 6,418,050 B2 | 7/2002 | Forbes |
| 6,420,279 B1 | 7/2002 | Ono et al. |
| 6,423,613 B1 | 7/2002 | Geusic |
| 6,426,292 B2 | 7/2002 | Vaartstra |
| 6,429,065 B2 | 8/2002 | Forbes |
| 6,434,041 B2 | 8/2002 | Forbes et al. |
| 6,441,417 B1 | 8/2002 | Zhang et al. |
| 6,444,592 B1 | 9/2002 | Ballantine et al. |
| 6,451,641 B1 | 9/2002 | Halliyal et al. |
| 6,451,695 B2 | 9/2002 | Sneh |
| 6,452,229 B1 | 9/2002 | Krivokapic |
| 6,454,912 B1 | 9/2002 | Ahn et al. |
| 6,455,330 B1 | 9/2002 | Yao et al. |
| 6,455,717 B1 | 9/2002 | Vaartstra |
| 6,458,701 B1 | 10/2002 | Chae et al. |
| 6,465,298 B2 | 10/2002 | Forbes et al. |
| 6,465,334 B1 | 10/2002 | Buynoski et al. |
| 6,465,853 B1 | 10/2002 | Hobbs et al. |
| 6,476,434 B1 | 11/2002 | Noble et al. |
| 6,482,740 B2 | 11/2002 | Soininen et al. |
| 6,486,027 B1 | 11/2002 | Noble et al. |
| 6,486,703 B2 | 11/2002 | Noble et al. |
| 6,492,233 B2 | 12/2002 | Forbes et al. |
| 6,495,436 B2 | 12/2002 | Ahn et al. |
| 6,495,437 B1 | 12/2002 | Yu |
| 6,495,458 B2 | 12/2002 | Marsh |
| 6,498,065 B1 | 12/2002 | Forbes et al. |
| 6,504,214 B1 | 1/2003 | Yu et al. |
| 6,506,666 B2 | 1/2003 | Marsh |
| 6,509,234 B1 | 1/2003 | Krivokapic |
| 6,509,280 B2 | 1/2003 | Choi |
| 6,514,820 B2 | 2/2003 | Ahn et al. |
| 6,514,828 B2 | 2/2003 | Ahn et al. |
| 6,515,510 B2 | 2/2003 | Noble et al. |
| 6,518,615 B1 | 2/2003 | Geusic et al. |
| 6,526,191 B1 | 2/2003 | Geusic et al. |
| 6,527,866 B1 | 3/2003 | Matijasevic et al. |
| 6,528,858 B1 | 3/2003 | Yu et al. |
| 6,531,324 B2 | 3/2003 | Hsu et al. |
| 6,531,354 B2 | 3/2003 | Maria et al. |
| 6,534,357 B1 | 3/2003 | Basceri |
| 6,534,420 B2 | 3/2003 | Ahn et al. |
| 6,537,613 B1 | 3/2003 | Senzaki et al. |
| 6,538,330 B1 | 3/2003 | Forbes |
| 6,540,214 B2 | 4/2003 | Barber |
| 6,541,079 B1 | 4/2003 | Bojarczuk, Jr. et al. |
| 6,541,280 B2 | 4/2003 | Kaushik et al. |
| 6,542,229 B1 | 4/2003 | Kalal et al. |
| 6,544,846 B2 | 4/2003 | Ahn et al. |
| 6,551,929 B1 | 4/2003 | Kori et al. |
| 6,552,383 B2 | 4/2003 | Ahn et al. |
| 6,552,388 B2 | 4/2003 | Wilk et al. |
| 6,555,879 B1 | 4/2003 | Krivokapic et al. |
| 6,559,014 B1 | 5/2003 | Jeon |
| 6,562,491 B1 | 5/2003 | Jeon |
| 6,566,147 B2 | 5/2003 | Basceri et al. |
| 6,566,682 B2 | 5/2003 | Forbes |
| 6,570,248 B1 | 5/2003 | Ahn et al. |
| 6,586,792 B2 | 7/2003 | Ahn et al. |
| 6,586,797 B2 | 7/2003 | Forbes et al. |
| 6,590,252 B2 | 7/2003 | Kutsunai et al. |
| 6,592,942 B1 | 7/2003 | Van Wijck |
| 6,596,583 B2 | 7/2003 | Agarwal et al. |
| 6,597,037 B1 | 7/2003 | Forbes et al. |
| 6,602,720 B2 | 8/2003 | Hsu et al. |
| 6,608,378 B2 | 8/2003 | Ahn et al. |
| 6,613,656 B2 | 9/2003 | Li |
| 6,613,695 B2 | 9/2003 | Pomarede et al. |
| 6,617,634 B2 | 9/2003 | Marsh et al. |
| 6,617,639 B1 | 9/2003 | Wang et al. |
| 6,620,752 B2 | 9/2003 | Messing et al. |
| 6,630,383 B1 | 10/2003 | Ibok et al. |
| 6,632,279 B1 | 10/2003 | Ritala et al. |
| 6,638,810 B2 | 10/2003 | Bakli et al. |
| 6,638,859 B2 | 10/2003 | Sneh et al. |
| 6,642,567 B1 | 11/2003 | Marsh |
| 6,645,573 B1 | 11/2003 | Halliyal et al. |
| 6,645,882 B1 | 11/2003 | Halliyal et al. |

| | | | | | | |
|---|---|---|---|---|---|---|
| 6,646,307 | B1 | 11/2003 | Yu et al. | 6,878,624 | B1 | 4/2005 | Bruley et al. |
| 6,652,924 | B2 | 11/2003 | Sherman | 6,884,739 | B2 | 4/2005 | Ahn et al. |
| 6,653,209 | B1 | 11/2003 | Yamagata | 6,888,739 | B2 | 5/2005 | Forbes |
| 6,656,764 | B1 | 12/2003 | Wang et al. | 6,893,984 | B2 | 5/2005 | Ahn et al. |
| 6,660,631 | B1 | 12/2003 | Marsh | 6,900,122 | B2 | 5/2005 | Ahn et al. |
| 6,660,660 | B2 | 12/2003 | Haukka et al. | 6,900,481 | B2 | 5/2005 | Jin et al. |
| 6,661,058 | B2 | 12/2003 | Ahn et al. | 6,903,367 | B2 | 6/2005 | Forbes |
| 6,674,138 | B1 | 1/2004 | Halliyal et al. | 6,914,800 | B2 | 7/2005 | Ahn et al. |
| 6,682,602 | B2 | 1/2004 | Vaartstra | 6,919,266 | B2 | 7/2005 | Ahn et al. |
| 6,686,212 | B1 | 2/2004 | Conley, Jr. et al. | 6,921,702 | B2 | 7/2005 | Ahn et al. |
| 6,689,660 | B1 | 2/2004 | Noble et al. | 6,929,830 | B2 | 8/2005 | Tei et al. |
| 6,690,055 | B1 | 2/2004 | Uhlenbrock et al. | 6,930,059 | B2 | 8/2005 | Conley, Jr. et al. |
| 6,699,747 | B2 | 3/2004 | Ruff et al. | 6,930,346 | B2 | 8/2005 | Ahn et al. |
| 6,709,978 | B2 | 3/2004 | Geusic et al. | 6,933,225 | B2 | 8/2005 | Werkhoven et al. |
| 6,709,989 | B2 | 3/2004 | Ramdani et al. | 6,949,433 | B1 | 9/2005 | Hidehiko et al. |
| 6,710,538 | B1 | 3/2004 | Ahn et al. | 6,950,340 | B2 | 9/2005 | Bhattacharyya |
| 6,713,671 | B1 | 3/2004 | Wang et al. | 6,952,032 | B2 | 10/2005 | Forbes et al. |
| 6,713,812 | B1 | 3/2004 | Hoefler et al. | 6,953,730 | B2 | 10/2005 | Ahn et al. |
| 6,713,846 | B1 | 3/2004 | Senzaki | 6,955,968 | B2 | 10/2005 | Forbes et al. |
| 6,720,216 | B2 | 4/2004 | Forbes | 6,958,302 | B2 | 10/2005 | Ahn et al. |
| 6,720,221 | B1 | 4/2004 | Ahn et al. | 6,958,937 | B2 | 10/2005 | Forbes et al. |
| 6,723,577 | B1 | 4/2004 | Geusic et al. | 6,960,538 | B2 | 11/2005 | Ahn et al. |
| 6,730,575 | B2 | 5/2004 | Eldridge | 6,963,103 | B2 | 11/2005 | Forbes |
| 6,744,063 | B2 | 6/2004 | Yoshikawa et al. | 6,970,053 | B2 | 11/2005 | Akram et al. |
| 6,746,930 | B2 | 6/2004 | Yang et al. | 6,979,855 | B2 | 12/2005 | Ahn et al. |
| 6,753,567 | B2 * | 6/2004 | Maria et al. ............ 257/310 | 6,982,230 | B2 | 1/2006 | Cabral, Jr., et al. |
| 6,754,108 | B2 | 6/2004 | Forbes | 6,984,591 | B1 * | 1/2006 | Buchanan et al. ............ 438/778 |
| 6,756,298 | B2 | 6/2004 | Ahn et al. | 6,989,565 | B1 | 1/2006 | Aronowitz et al. |
| 6,759,151 | B1 | 7/2004 | Lee | 6,989,573 | B2 | 1/2006 | Ahn et al. |
| 6,760,257 | B2 | 7/2004 | Huang et al. | 7,005,391 | B2 | 2/2006 | Min et al. |
| 6,764,901 | B2 | 7/2004 | Noble | 7,005,697 | B2 | 2/2006 | Batra et al. |
| 6,767,582 | B1 | 7/2004 | Elers | 7,012,297 | B2 | 3/2006 | Bhattacharyya |
| 6,767,795 | B2 | 7/2004 | Ahn et al. | 7,019,351 | B2 | 3/2006 | Eppich et al. |
| 6,768,175 | B1 | 7/2004 | Morishita et al. | 7,026,694 | B2 | 4/2006 | Ahn et al. |
| 6,770,536 | B2 | 8/2004 | Wilk et al. | 7,042,043 | B2 | 5/2006 | Forbes et al. |
| 6,774,050 | B2 | 8/2004 | Ahn et al. | 7,045,430 | B2 | 5/2006 | Ahn et al. |
| 6,777,353 | B2 | 8/2004 | Putkonen | 7,049,192 | B2 | 5/2006 | Ahn et al. |
| 6,777,715 | B1 | 8/2004 | Geusic et al. | 7,057,244 | B2 | 6/2006 | Andreoni et al. |
| 6,778,441 | B2 | 8/2004 | Forbes et al. | 7,064,058 | B2 | 6/2006 | Ahn et al. |
| 6,780,704 | B1 | 8/2004 | Raaijmakers et al. | 7,068,544 | B2 | 6/2006 | Forbes et al. |
| 6,784,101 | B1 | 8/2004 | Yu et al. | 7,074,380 | B2 | 7/2006 | Iwaki et al. |
| 6,787,370 | B2 | 9/2004 | Forbes et al. | 7,074,673 | B2 | 7/2006 | Forbes |
| 6,787,413 | B2 | 9/2004 | Ahn | 7,075,829 | B2 | 7/2006 | Forbes |
| 6,790,791 | B2 | 9/2004 | Ahn et al. | 7,081,421 | B2 | 7/2006 | Ahn et al. |
| 6,794,315 | B1 | 9/2004 | Klemperer et al. | 7,084,078 | B2 | 8/2006 | Ahn et al. |
| 6,794,709 | B2 | 9/2004 | Ahn et al. | 7,087,954 | B2 | 8/2006 | Forbes |
| 6,797,561 | B2 | 9/2004 | Ko et al. | 7,101,813 | B2 | 9/2006 | Ahn et al. |
| 6,800,567 | B2 | 10/2004 | Cho | 7,112,841 | B2 | 9/2006 | Eldridge et al. |
| 6,803,311 | B2 | 10/2004 | Choi | 7,122,415 | B2 | 10/2006 | Jang et al. |
| 6,803,326 | B2 | 10/2004 | Ahn et al. | 7,129,553 | B2 | 10/2006 | Ahn et al. |
| 6,804,136 | B2 | 10/2004 | Forbes | 7,135,369 | B2 | 11/2006 | Ahn et al. |
| 6,806,211 | B2 | 10/2004 | Shinriki et al. | 7,135,421 | B2 | 11/2006 | Ahn et al. |
| 6,808,978 | B2 | 10/2004 | Kim | 7,135,734 | B2 | 11/2006 | Eldridge et al. |
| 6,812,100 | B2 | 11/2004 | Ahn et al. | 7,160,577 | B2 | 1/2007 | Ahn et al. |
| 6,812,157 | B1 | 11/2004 | Gadgil | 7,160,817 | B2 | 1/2007 | Marsh |
| 6,812,513 | B2 | 11/2004 | Geusic et al. | 7,166,886 | B2 | 1/2007 | Forbes |
| 6,812,516 | B2 | 11/2004 | Noble, Jr. et al. | 7,169,673 | B2 | 1/2007 | Ahn et al. |
| 6,818,937 | B2 | 11/2004 | Noble et al. | 7,183,186 | B2 | 2/2007 | Ahn et al. |
| 6,821,862 | B2 | 11/2004 | Cho | 7,187,587 | B2 | 3/2007 | Forbes |
| 6,821,873 | B2 | 11/2004 | Visokay et al. | 7,192,824 | B2 | 3/2007 | Ahn et al. |
| 6,831,315 | B2 | 12/2004 | Raaijmakers et al. | 7,192,892 | B2 | 3/2007 | Ahn et al. |
| 6,833,285 | B1 | 12/2004 | Ahn et al. | 7,195,999 | B2 | 3/2007 | Forbes et al. |
| 6,833,308 | B2 | 12/2004 | Ahn et al. | 7,199,023 | B2 | 4/2007 | Ahn et al. |
| 6,835,111 | B2 | 12/2004 | Ahn et al. | 7,205,218 | B2 | 4/2007 | Ahn et al. |
| 6,838,404 | B2 | 1/2005 | Hentges et al. | 7,205,620 | B2 | 4/2007 | Ahn et al. |
| 6,844,203 | B2 | 1/2005 | Ahn et al. | 7,208,804 | B2 | 4/2007 | Ahn et al. |
| 6,844,260 | B2 | 1/2005 | Sarigiannis et al. | 7,211,492 | B2 | 5/2007 | Forbes et |
| 6,844,604 | B2 | 1/2005 | Lee et al. | 7,214,994 | B2 | 5/2007 | Forbes et al. |
| 6,852,167 | B2 | 2/2005 | Ahn | 7,221,017 | B2 | 5/2007 | Forbes et al. |
| 6,858,120 | B2 | 2/2005 | Ahn et al. | 7,221,586 | B2 | 5/2007 | Forbes et al. |
| 6,858,444 | B2 | 2/2005 | Ahn et al. | 7,235,501 | B2 | 6/2007 | Ahn et al. |
| 6,858,865 | B2 | 2/2005 | Ahn et al. | 7,235,854 | B2 | 6/2007 | Ahn et al. |
| 6,864,191 | B2 | 3/2005 | Yoon, D | 7,259,434 | B2 | 8/2007 | Ahn et al. |

| | | |
|---|---|---|
| 7,274,067 B2 | 9/2007 | Forbes |
| 7,297,617 B2 | 11/2007 | Farrar et al. |
| 2001/0002280 A1 | 5/2001 | Sneh |
| 2001/0009695 A1 | 7/2001 | Saanila et al. |
| 2001/0030352 A1 | 10/2001 | Ruf et al. |
| 2001/0042505 A1 | 11/2001 | Vaartstra |
| 2002/0000593 A1 | 1/2002 | Nishiyama et al. |
| 2002/0001971 A1 | 1/2002 | Cho |
| 2002/0004276 A1 | 1/2002 | Ahn et al. |
| 2002/0004277 A1 | 1/2002 | Ahn et al. |
| 2002/0019116 A1 | 2/2002 | Sandhu et al. |
| 2002/0024080 A1 | 2/2002 | Derderian et al. |
| 2002/0025628 A1 | 2/2002 | Derderian et al. |
| 2002/0028541 A1 | 3/2002 | Lee et al. |
| 2002/0046705 A1 | 4/2002 | Sandhu et al. |
| 2002/0048910 A1 | 4/2002 | Taylor, Jr. et al. |
| 2002/0053869 A1 | 5/2002 | Ahn et al. |
| 2002/0068466 A1 | 6/2002 | Lee et al. |
| 2002/0072164 A1 | 6/2002 | Umotoy et al. |
| 2002/0083464 A1 | 6/2002 | Tomsen et al. |
| 2002/0086507 A1 | 7/2002 | Park et al. |
| 2002/0086521 A1 | 7/2002 | Ahn et al. |
| 2002/0086555 A1 | 7/2002 | Ahn et al. |
| 2002/0089023 A1 | 7/2002 | Yu et al. |
| 2002/0089063 A1 | 7/2002 | Ahn et al. |
| 2002/0094632 A1 | 7/2002 | Agarwal et al. |
| 2002/0100418 A1 | 8/2002 | Sanjgu et al. |
| 2002/0102818 A1 | 8/2002 | Sandhu et al. |
| 2002/0110991 A1 | 8/2002 | Li |
| 2002/0111001 A1 | 8/2002 | Ahn |
| 2002/0122885 A1 | 9/2002 | Ahn |
| 2002/0130338 A1 | 9/2002 | Ahn et al. |
| 2002/0135048 A1 | 9/2002 | Ahn et al. |
| 2002/0142536 A1 | 10/2002 | Zhang et al. |
| 2002/0146916 A1 | 10/2002 | Irino et al. |
| 2002/0155688 A1 | 10/2002 | Ahn et al. |
| 2002/0155689 A1 | 10/2002 | Ahn et al. |
| 2002/0164420 A1 | 11/2002 | Derderian et al. |
| 2002/0167057 A1 | 11/2002 | Ahn et al. |
| 2002/0167089 A1 | 11/2002 | Ahn et al. |
| 2002/0170671 A1 | 11/2002 | Matsuhita et al. |
| 2002/0177244 A1 | 11/2002 | Hsu et al. |
| 2002/0177282 A1 | 11/2002 | Song |
| 2002/0190294 A1 | 12/2002 | Iizuka et al. |
| 2002/0192974 A1 | 12/2002 | Ahn et al. |
| 2002/0192975 A1 | 12/2002 | Ahn |
| 2002/0192979 A1 | 12/2002 | Ahn |
| 2002/0195056 A1 | 12/2002 | Sandhu et al. |
| 2002/0196405 A1 | 12/2002 | Colgan et al. |
| 2002/0197856 A1 | 12/2002 | Matsuse et al. |
| 2002/0197881 A1 | 12/2002 | Ramdani et al. |
| 2003/0001241 A1 | 1/2003 | Chakrabarti et al. |
| 2003/0003635 A1 | 1/2003 | Paranjpe et al. |
| 2003/0003702 A1 | 1/2003 | Ahn |
| 2003/0003722 A1 | 1/2003 | Vaartstra |
| 2003/0003730 A1 | 1/2003 | Li |
| 2003/0004051 A1 | 1/2003 | Kim et al. |
| 2003/0008243 A1 | 1/2003 | Ahn et al. |
| 2003/0017717 A1 | 1/2003 | Ahn |
| 2003/0020180 A1 | 1/2003 | Ahn et al. |
| 2003/0027360 A1 | 2/2003 | Hsu et al. |
| 2003/0032238 A1 | 2/2003 | Kim et al. |
| 2003/0032270 A1 | 2/2003 | Snyder et al. |
| 2003/0040196 A1 | 2/2003 | Lim et al. |
| 2003/0042527 A1 | 3/2003 | Forbes et al. |
| 2003/0043633 A1 | 3/2003 | Forbes et al. |
| 2003/0043637 A1 | 3/2003 | Forbes et al. |
| 2003/0045060 A1 | 3/2003 | Ahn et al. |
| 2003/0045078 A1 | 3/2003 | Ahn et al. |
| 2003/0045082 A1 | 3/2003 | Eldridge et al. |
| 2003/0048666 A1 | 3/2003 | Eldridge et al. |
| 2003/0049900 A1 | 3/2003 | Forbes et al. |
| 2003/0049942 A1 | 3/2003 | Haukka et al. |
| 2003/0059535 A1 | 3/2003 | Luo et al. |
| 2003/0064607 A1 | 4/2003 | Leu et al. |
| 2003/0068848 A1 | 4/2003 | Hsu et al. |
| 2003/0072882 A1 | 4/2003 | Niinisto et al. |
| 2003/0104666 A1 | 6/2003 | Bojarczuk, Jr. et al. |
| 2003/0119246 A1 | 6/2003 | Ahn |
| 2003/0119291 A1 | 6/2003 | Ahn et al. |
| 2003/0119313 A1 | 6/2003 | Yang et al. |
| 2003/0124748 A1 | 7/2003 | Summerfelt et al. |
| 2003/0124791 A1 | 7/2003 | Summerfelt et al. |
| 2003/0130127 A1 | 7/2003 | Hentges et al. |
| 2003/0132491 A1 | 7/2003 | Ahn |
| 2003/0136995 A1 | 7/2003 | Geusic et al. |
| 2003/0139039 A1 | 7/2003 | Ahn et al. |
| 2003/0141560 A1 | 7/2003 | Sun |
| 2003/0142569 A1 | 7/2003 | Forbes |
| 2003/0157764 A1 | 8/2003 | Ahn et al. |
| 2003/0161081 A1 | 8/2003 | Girardie |
| 2003/0162399 A1 | 8/2003 | Singh et al. |
| 2003/0170389 A1 | 9/2003 | Sandhu |
| 2003/0170403 A1 | 9/2003 | Doan et al. |
| 2003/0172872 A1 | 9/2003 | Thakur et al. |
| 2003/0175411 A1 | 9/2003 | Kodas et al. |
| 2003/0176049 A1 | 9/2003 | Hegde et al. |
| 2003/0179521 A1 | 9/2003 | Girardie |
| 2003/0181039 A1 | 9/2003 | Sandhu et al. |
| 2003/0181060 A1 | 9/2003 | Asai et al. |
| 2003/0183156 A1 | 10/2003 | Dando et al. |
| 2003/0185980 A1 | 10/2003 | Endo |
| 2003/0205742 A1 | 11/2003 | Hsu et al. |
| 2003/0205774 A1 | 11/2003 | Hokazono |
| 2003/0207032 A1 | 11/2003 | Ahn et al. |
| 2003/0207540 A1 | 11/2003 | Ahn et al. |
| 2003/0213987 A1 | 11/2003 | Basceri |
| 2003/0216038 A1 | 11/2003 | Madhukar et al. |
| 2003/0222300 A1 | 12/2003 | Basceri et al. |
| 2003/0227033 A1 | 12/2003 | Ahn et al. |
| 2003/0228747 A1 | 12/2003 | Ahn et al. |
| 2003/0235961 A1 | 12/2003 | Metzner et al. |
| 2004/0004244 A1 | 1/2004 | Ahn et al. |
| 2004/0004245 A1 | 1/2004 | Forbes et al. |
| 2004/0004247 A1 | 1/2004 | Forbes |
| 2004/0004859 A1 | 1/2004 | Forbes |
| 2004/0005982 A1 | 1/2004 | Park et al. |
| 2004/0007171 A1 | 1/2004 | Ritala et al. |
| 2004/0009679 A1 | 1/2004 | Yeo et al. |
| 2004/0013009 A1 | 1/2004 | Tsunoda et al. |
| 2004/0016944 A1 | 1/2004 | Ahn et al. |
| 2004/0023461 A1 | 2/2004 | Ahn et al. |
| 2004/0023516 A1 | 2/2004 | Londergan et al. |
| 2004/0028811 A1 | 2/2004 | Cho et al. |
| 2004/0033661 A1 | 2/2004 | Yeo et al. |
| 2004/0033681 A1 | 2/2004 | Ahn et al. |
| 2004/0033701 A1 | 2/2004 | Ahn et al. |
| 2004/0036129 A1 | 2/2004 | Forbes et al. |
| 2004/0038554 A1 | 2/2004 | Ahn |
| 2004/0040494 A1 | 3/2004 | Vaartstra et al. |
| 2004/0041591 A1 | 3/2004 | Forbes |
| 2004/0043541 A1 | 3/2004 | Ahn et al. |
| 2004/0043569 A1 | 3/2004 | Ahn et al. |
| 2004/0043578 A1 | 3/2004 | Marsh |
| 2004/0043635 A1 | 3/2004 | Vaartstra |
| 2004/0066484 A1 | 4/2004 | Tokailin et al. |
| 2004/0076035 A1 | 4/2004 | Saito et al. |
| 2004/0092073 A1 | 5/2004 | Cabral, Jr. et al. |
| 2004/0094801 A1 | 5/2004 | Liang et al. |
| 2004/0097022 A1 | 5/2004 | Werkhoven et al. |
| 2004/0104439 A1 | 6/2004 | Haukka et al. |
| 2004/0106249 A1 | 6/2004 | Huotari |
| 2004/0110348 A1 | 6/2004 | Ahn et al. |
| 2004/0110391 A1 | 6/2004 | Ahn et al. |
| 2004/0135186 A1 | 7/2004 | Yamamoto |
| 2004/0140513 A1 | 7/2004 | Forbes et al. |

| | | | | | | |
|---|---|---|---|---|---|---|
| 2004/0144980 A1 | 7/2004 | Ahn et al. | | 2005/0277256 A1 | 12/2005 | Ahn et al. |
| 2004/0156578 A1 | 8/2004 | Geusic et al. | | 2005/0280067 A1 | 12/2005 | Ahn et al. |
| 2004/0159863 A1 | 8/2004 | Eldridge et al. | | 2006/0000412 A1 | 1/2006 | Ahn et al. |
| 2004/0161899 A1 | 8/2004 | Luo et al. | | 2006/0001151 A1 | 1/2006 | Ahn et al. |
| 2004/0164357 A1 | 8/2004 | Ahn et al. | | 2006/0003517 A1 | 1/2006 | Ahn et al. |
| 2004/0164365 A1 | 8/2004 | Ahn et al. | | 2006/0008966 A1 | 1/2006 | Forbes et al. |
| 2004/0168627 A1 | 9/2004 | Conley, Jr. et al. | | 2006/0019033 A1 | 1/2006 | Muthukrishnan et al. |
| 2004/0169453 A1 | 9/2004 | Ahn et al. | | 2006/0023513 A1 | 2/2006 | Forbes et al. |
| 2004/0171280 A1 | 9/2004 | Conley, Jr. et al. | | 2006/0024975 A1 | 2/2006 | Ahn et al. |
| 2004/0175882 A1 | 9/2004 | Ahn et al. | | 2006/0028867 A1 | 2/2006 | Forbes et al. |
| 2004/0178439 A1 | 9/2004 | Ahn et al. | | 2006/0028869 A1 | 2/2006 | Forbes et al. |
| 2004/0183108 A1 | 9/2004 | Ahn | | 2006/0033165 A1 | 2/2006 | Chan et al. |
| 2004/0185654 A1 | 9/2004 | Ahn | | 2006/0043504 A1 | 3/2006 | Ahn et al. |
| 2004/0189175 A1 | 9/2004 | Ahn et al. | | 2006/0046505 A1 | 3/2006 | Ahn et al. |
| 2004/0203254 A1 | 10/2004 | Conley, Jr. et al. | | 2006/0046522 A1 | 3/2006 | Ahn et al. |
| 2004/0214399 A1 | 10/2004 | Ahn et al. | | 2006/0125030 A1 | 6/2006 | Ahn et al. |
| 2004/0217410 A1 | 11/2004 | Meng et al. | | 2006/0128168 A1 | 6/2006 | Ahn et al. |
| 2004/0219783 A1 | 11/2004 | Ahn et al. | | 2006/0148180 A1 | 7/2006 | Ahn et al. |
| 2004/0222476 A1 | 11/2004 | Ahn et al. | | 2006/0176645 A1 | 8/2006 | Ahn et al. |
| 2004/0229745 A1 | 11/2004 | Miyauchi et al. | | 2006/0177975 A1 | 8/2006 | Ahn et al. |
| 2004/0233010 A1 | 11/2004 | Akram et al. | | 2006/0183272 A1 | 8/2006 | Ahn et al. |
| 2004/0235313 A1 | 11/2004 | Frank et al. | | 2006/0189154 A1 | 8/2006 | Ahn et al. |
| 2004/0248398 A1 | 12/2004 | Ahn et al. | | 2006/0223337 A1 | 10/2006 | Ahn et al. |
| 2004/0262700 A1 | 12/2004 | Ahn et al. | | 2006/0228868 A1 | 10/2006 | Ahn et al. |
| 2004/0264236 A1 | 12/2004 | Chae et al. | | 2006/0237764 A1 | 10/2006 | Ahn et al. |
| 2004/0266117 A1 | 12/2004 | Hwang | | 2006/0244082 A1 | 11/2006 | Ahn et al. |
| 2004/0266217 A1 | 12/2004 | Kim et al. | | 2006/0244100 A1 | 11/2006 | Ahn et al. |
| 2005/0009335 A1 | 1/2005 | Dean et al. | | 2006/0245984 A1 | 11/2006 | Kulkarni et al. |
| 2005/0009370 A1 | 1/2005 | Ahn | | 2006/0246741 A1 | 11/2006 | Ahn et al. |
| 2005/0020017 A1 | 1/2005 | Ahn et al. | | 2006/0252211 A1 | 11/2006 | Ahn et al. |
| 2005/0023574 A1 | 2/2005 | Forbes et al. | | 2006/0255470 A1 | 11/2006 | Ahn et al. |
| 2005/0023594 A1 | 2/2005 | Ahn et al. | | 2006/0258097 A1 | 11/2006 | Forbes et al. |
| 2005/0023595 A1 | 2/2005 | Forbes et al. | | 2006/0261376 A1 | 11/2006 | Forbes et al. |
| 2005/0023602 A1 | 2/2005 | Forbes et al. | | 2006/0261397 A1 | 11/2006 | Ahn et al. |
| 2005/0023603 A1 | 2/2005 | Eldridge et al. | | 2006/0263972 A1 | 11/2006 | Ahn et al. |
| 2005/0023624 A1 | 2/2005 | Ahn et al. | | 2006/0263981 A1 | 11/2006 | Forbes |
| 2005/0023625 A1 | 2/2005 | Ahn et al. | | 2006/0264064 A1 | 11/2006 | Ahn et al. |
| 2005/0023626 A1 | 2/2005 | Ahn et al. | | 2006/0270147 A1 | 11/2006 | Ahn et al. |
| 2005/0023627 A1 | 2/2005 | Ahn et al. | | 2006/0274580 A1 | 12/2006 | Forbes |
| 2005/0024092 A1 | 2/2005 | Forbes | | 2006/0281330 A1 | 12/2006 | Ahn et al. |
| 2005/0026349 A1 | 2/2005 | Forbes et al. | | 2006/0284246 A1 | 12/2006 | Forbes et al. |
| 2005/0026360 A1 | 2/2005 | Geusic et al. | | 2007/0018214 A1 | 1/2007 | Ahn |
| 2005/0026374 A1 | 2/2005 | Ahn et al. | | 2007/0020835 A1 | 1/2007 | Ahn et al. |
| 2005/0026458 A1 | 2/2005 | Basceri et al. | | 2007/0037415 A1 | 2/2007 | Ahn et al. |
| 2005/0029547 A1 | 2/2005 | Ahn et al. | | 2007/0046402 A1 | 3/2007 | Mukaiyama et al. |
| 2005/0029604 A1 | 2/2005 | Ahn et al. | | 2007/0048926 A1 | 3/2007 | Ahn |
| 2005/0029605 A1 | 2/2005 | Ahn et al. | | 2007/0049054 A1 | 3/2007 | Ahn et al. |
| 2005/0030825 A1 | 2/2005 | Ahn | | 2007/0059881 A1 | 3/2007 | Ahn et al. |
| 2005/0032292 A1 | 2/2005 | Ahn et al. | | 2007/0087563 A1 | 4/2007 | Ahn et al. |
| 2005/0032342 A1 | 2/2005 | Forbes et al. | | 2007/0090440 A1 | 4/2007 | Ahn et al. |
| 2005/0034662 A1 | 2/2005 | Ahn | | 2007/0090441 A1 | 4/2007 | Ahn et al. |
| 2005/0037563 A1 | 2/2005 | Ahn | | 2007/0092989 A1 | 4/2007 | Kraus et al. |
| 2005/0051828 A1 | 3/2005 | Park et al. | | 2007/0099366 A1 | 5/2007 | Ahn et al. |
| 2005/0054165 A1 | 3/2005 | Ahn et al. | | 2007/0101929 A1 | 5/2007 | Ahn et al. |
| 2005/0070098 A1 | 3/2005 | Bruley | | 2007/0105313 A1 | 5/2007 | Forbes |
| 2005/0077519 A1 | 4/2005 | Ahn et al. | | 2007/0107661 A1 | 5/2007 | Ahn |
| 2005/0087134 A1 | 4/2005 | Ahn | | 2007/0111544 A1 | 5/2007 | Ahn |
| 2005/0118807 A1 | 6/2005 | Kim et al. | | 2007/0131169 A1 | 6/2007 | Ahn |
| 2005/0124109 A1 | 6/2005 | Quevedo-Lopez et al. | | 2007/0134931 A1 | 6/2007 | Ahn et al. |
| 2005/0124174 A1 | 6/2005 | Ahn et al. | | 2007/0134942 A1 | 6/2007 | Ahn et al. |
| 2005/0124175 A1 | 6/2005 | Ahn et al. | | 2007/0158765 A1 | 7/2007 | Ahn et al. |
| 2005/0138262 A1 | 6/2005 | Forbes | | 2007/0178643 A1 | 8/2007 | Forbes et al. |
| 2005/0140462 A1 | 6/2005 | Akram et al. | | 2007/0181931 A1 | 8/2007 | Ahn et al. |
| 2005/0145957 A1 | 7/2005 | Ahn et al. | | 2008/0048225 A1 | 2/2008 | Ahn et al. |
| 2005/0145959 A1 | 7/2005 | Forbes | | 2008/0057659 A1 | 3/2008 | Forbes |
| 2005/0158973 A1 | 7/2005 | Ahn et al. | | 2008/0057690 A1 | 3/2008 | Forbes |
| 2005/0164521 A1 | 7/2005 | Ahn et al. | | 2008/0193791 A1 | 8/2008 | Ahn et al. |
| 2005/0169054 A1 | 8/2005 | Forbes | | | | |
| 2005/0173755 A1 | 8/2005 | Forbes | | FOREIGN PATENT DOCUMENTS | | |
| 2005/0215015 A1 | 9/2005 | Ahn et al. | | | | |
| 2005/0218462 A1 | 10/2005 | Ahn et al. | | EP | 1124262 | 8/2001 |
| 2005/0227442 A1 | 10/2005 | Ahn et al. | | EP | 1124262 A2 | 8/2001 |
| 2005/0260357 A1 | 11/2005 | Olsen et al. | | WO | WO-01/97257 | 12/2001 |

| | | |
|---|---|---|
| WO | WO-02/31875 | 4/2002 |
| WO | WO-02/43115 | 5/2002 |

OTHER PUBLICATIONS

Copel, M., et al., "Structure and stability of ultrathin zirconium oxide layers on Si(001)", *Applied Physics Letters*, 76(4), (Jan. 2000),436-438.

Ho, M.-Y., et al., "Suppressed crystallization of Hf-based gate dielectrics by controlled addition of $Al_2O_3$ using atomic layer deposition", *Applied Physics Letters*, vol. 81, No. 22, (Nov. 2002),4218-4220.

Iwamoto, K., "Advanced Layer-By-Layer Deposition and Annealing Process For High-Quality High-K Dielectrics Formation", *Electrochemical Society Proceedings* vol. 2003 (14), (2003),265-272.

Jeong, Chang-Wook, "Plasma-Assisted Atomic Layer Growth of High-Quality Aluminum Oxide Thin Films", *Japanese Journal of Applied Physics, Part 1: Regular Papers and Short Notes and Review Papers*, 40(1), (Jan. 2001),285-289.

Jun, Jin H., et al., "Effect of Structural Properties on Electrical Properties of Lanthanum Oxide Thin Film as a Gate Dielectric", *Japanese Journal of Applied Physics, 42, Part 1, No. 6A*, (Jun. 15, 2003),3519-3522.

Jun, Jin H., et al., "Properties of Lanthanum Aluminate Thin Film Deposited by MOCVD", *Electrochemical and Solid-State Letters*, 6(11), 2003,F37-F39.

Jun, Jino, et al., "Study on the precursors for $La_2O_3$ thin films deposited on silicon substrate", *Journal of Materials Science Letters* 21, (2002)1847-1849.

Kim, C. T., "Application of $Al_2O_3$ Grown by Atomic Layer Deposition to DRAM and FeRAM", *12th International Symposium in Integrated Ferroelectrics*, (Mar. 2000),p. 316.

Kim, Y, "Substrate dependence on the optical properties of $Al_2O_3$ films grown by atomic layer deposition", *Applied Physics Letters*, vol. 71, No. 25, (Dec. 22, 1997),3604-3606.

Kingon, Angus I., et al., "Alternative dielectrics to Silicon dioxide for Memory and Logic Devices", *Nature*, vol. 406, (Aug. 31, 2000),1032-1038.

Lee, Byoung H., et al., "Thermal stability and electrical characteristics of ultrathin hafnium oxide gate dielectric reoxidized with rapid thermal annealing", *Applied Physics Letters*, 76(14), (Apr. 3, 2000),1926-1928.

Leskela, M., "ALD precursor chemistry: Evolution and future challenges", *J. Phys. IV France*, 9, (1999),837-352.

Li, Al-Dong, "Characteristics of $LaAlO_3$ gate dielectrics on Si grown by metalorganic chemical vapor deposition", *Applied Physics Letters*, vol. 83, No. 17, (Oct. 27, 2003),3540-3542.

Lu, X. B., et al., "Investigation of high-quality ultra-thin $LaAlO_3$ films as high-k gate dielectrics", *Journal of Physics D: Applied Physics*, 36, (Dec. 7, 2003),3047-3050.

Lu, Xu-Bing, et al., "Structure and dielectric prioperties of amorphous $LaAlO_3$ and $LaAlOxNy$ films as alternative gate dielectric materials", *Journal of Applied Physics*, vol. 94, No. 2, (Jul. 15, 2003), 1229-1234.

Park, Dae-Gyu, et al., "Characteristics of $Al_2O_3$ Gate Dielectrics Prepared by Atomic Layer Deposition for Giga Scale CMOS DRAM Devices", *2000 Symposium on VLSI Technology Digest of Technical Papers*, (2000),46-47.

Ritala, M., "Atomic layer deposition of oxide thin films with metal alkoxides as oxygen sources", *Science*, 288(5464), (Apr. 14, 2000),319-321.

Roy, P. K., et al., "Stacked high-E gate dielectric for gigascale integration of metal-oxide-semiconductor technologies", *Applied Physics Letters*, vol. 72, No. 22, (Jun. 1998),2835-2837.

Shin, Chang H., "Fabrication and Characterization of MFISFET Using $Al_2O_3$ Insulating Layer for Non-volatile Memory", *12th International Symposium in Integrated Ferroelectrics*, (Mar. 2000),9 pages.

Sneh, Ofer, "Thin film atomic layer deposition equipment for semiconductor processing", *Thin Solid Films*, 402(1-2), (2002),248-261.

Van Dover, R. B., "Amorphous lanthanide-doped TiOx dielectric films", *Applied Physics Letters*, 74(20), (May 17, 1999),3041-3043.

Wilk, G. D., "High-K gate dielectrics: Current status and materials properties considerations", *Journal of Applied Physics*,89(10), (May 2001),5243-5275.

Yan, L., "High quality, high-k gate dielectric: amorphous $LaAlO_3$ thin films grown on Si(100) without Si interfacial layer", *Appl. Phys. A* 77, (2003),721-724.

Ahn, Kie Y., "ALD of Amorphous Lanthanide Doped $TiO_x$ Films", U.S. Appl. No. 11/092,072, filed Mar. 29, 2005.

Ahn, Kie Y., "Atomic Layer Deposited Hafnium Tantalum Oxide Dielectrics", U.S. Appl. No. 11/029,757, filed Jan. 5 2005.

Ahn, Kie Y., "Atomic Layer Deposited Lanthanum Aluminum Oxide Dielectric Layer", U.S. Appl. No. 10/930,167, filed Aug. 31, 2004.

Ahn, Kie Y., "Atomic Layer Deposited Lanthanum Hafnium Oxide Dielectrics", U.S. Appl. No. 11/010,529, filed Dec. 13, 2004.

Ahn, Kie Y., "Atomic Layer Deposited Titanium Aluminum Oxide Films", U.S. Appl. No. 10/931,533, filed Aug. 31, 2004.

Ahn, Kie Y., "Atomic Layer Deposition of $Hf_3N_4/HfO_2$ Films as Gate Dielectrics", U.S. Appl. No. 11/063,717, filed Feb. 23, 2005.

Ahn, Kie Y., et al., "Atomic Layer Deposition of Zirconium-Doped Tantalum Oxide Films", U.S. Appl. No. 10/909,959, filed Aug. 2, 2004.

Ahn, Kie Y., "Atomic Layer Deposition of $Zr_3N_4/ZrO_2$ Films as Gate Dielectrics", U.S. Appl. No. 11/058,563, filed Feb. 15, 2005.

Ahn, Kie Y., "Hybrid ALD-CVD of $Pr_xO_y/ZrO_2$ Films as Gate Dielectrics", U.S. Appl. No. 11/010,766, filed Dec. 13, 2004.

Chin, A., et al, "High Quality $La_2O_3$ and $Al_2O_3$ Gate Dielectrics with Equivalent Oxide Thickness 5-10A", *Digest of Technical Papers. 2000 Symposium on VLSI Technology*, 2000, Honolulu,(Jun. 13-15, 2000),16-17.

Copel, M., et al., "Formation of a stratified lanthanum silicate dielectric by reaction with Si(001)", *Applied Physics Letters*, 78(11), (Mar. 12, 2001),1607-1609.

Dimoulas, A., et al., "Structural and electrical quality of the high-k dielectric $Y_2O_3$ on Si (001): Dependence on growth parameters", *Journal of Applied Physics*, 92(1), (Jul. 1, 2002),426-431.

Geller, S., et al., "Crystallographic Studies of Perovskite-like Compounds. II. Rare Earth Aluminates", *Acta Cryst.*, 9, (May 1956),1019-1025.

Giess, E. A., et al., "Lanthanide gallate perovskite-type substrates for epitaxial, high-$T_c$/ superconducting $Ba_2YCu_3O_{7-\delta}$ films", *IBM Journal of Research and Development*, 34(6), (Nov. 1990),916-926.

Guha, S, et al., "Atomic beam deposition of lanthanum-and yttrium-based oxide thin films for gate dielectrics", *Applied Physics Letters*, 77, (2000),2710-2712.

Guha, S., et al., "High temperature stability of $Al_2O_3$ dielectrics on Si: Interfacial metal diffusion and mobility degradation", *Applied Physics Letters*, vol. 81, No. 16, (Oct. 14, 2002),2956-2958.

Huang, C. H., et al., "$La_2O_3$/ $Si_3Ge._7$/ p-MOSFETs with high hole mobility and good device characteristics", *IEEE Electron Device Letters*, 23(12), (Dec. 2002),710-712.

Hubbard, K. J., et al., "Thermodynamic stability of binary oxides in contact with silicon", *Journal of Materials Research*, 11(11), (Nov. 1996),2757-2776.

Iwai, H., et al., "Advanced gate dielectric materials for sub-100 nm CMOS", *International Electron Devices Meeting*, 2002. IEDM '02. Digest., (Dec. 8-11, 2002),625-628.

Jeon, Sanghun, et al., "Excellent electrical characteristics of lanthanide (Pr, Nd, Sm, Gd, and Dy) oxide and lanthanide-doped oxide for MOS gate dielectric applications", *Electron Devices Meeting*, 2001. IEDM Technical Digest. International, (2001),471-474.

Kim, D., et al., "Atomic Control of Substrate Termination and Heteroepitaxial Growth of Sr $TiO_3$/ $LaAlO_3$ Films", *Journal of the Korean Physical Society*, 36(6), (Jun. 2000),444-448.

Kwo, J., et al., "High E gate dielectrics $Gd_2O_3$ and $Y_2O_3$ for silicon", *Applied Physics Letters*, 77(1), (Jul. 3, 2000),130-132.

Kwo, J., "Properties of high k gate dielectrics $Gd_2O_3$ and $Y_2O_3$ for Si", *Journal of Applied Physics*, 89(7), (2001),3920-3927.

Lee, A E., et al., "Epitaxlally grown sputtered $LaAlO_3$ films", *Applied Physics Letters*, 57(19), (Nov. 1990),2019-2021.

Maria, J. P., et al., "High temperature stability in lanthanum and zirconia-based gate dielectrics", *Journal of Applied Physics*, 90(7), (Oct. 1, 2001),3476-3482.

Michaelson, Herbert B., "The work function of the elements and its periodicity", *Journal of Applied Physics*, 48(11), (Nov. 1977),4729-4733.

Molodyk, A A., et al., "Volatile Surfactant-Assisted MOCVD: Application to LaAlO3 Thin Film Growth", *Chemical Vapor Deposition*, 6(3), (Jun. 2000),133-138.

Nieminen, Minna, et al., "Formation and stability of lanthanum oxide thin films deposited from B-diketonate precursor", *Applied Surface Science*, 174(2), (Apr. 16, 2001),155-165.

Osten, H. J., et al., "High-k gate dielectrics with ultra-low leakage current based on praseodymium oxide", *International Electron Devices Meeting 2000. Technical Digest. IEDM*, (2000),653-656.

Park, Byung-Eun, et al., "Electrical properties of $Sr_{0.8}Bi_{2.2}Ta_2O_9$/$LaAlO_3$/Si structures", *Applied Physics Letters*, 79(6), (Aug. 2001),806-808.

Robertson, J., "Band offsets of wide-band-gap oxides and implications for future electronic devices", *Journal of Vacuum Science & Technolooy B (Microelectronics and Nanometer Structures)*, 18(3), (May-Jun. 2000),1785-1791.

Shimizu, Takashi, et al., "Electrical Properties of Ruthenium/Metalorganic Chemical Vapor Deposited La-Oxide/Si Field Effect Transistors", *Jpn. J. Appl. Phys.*, vol. 42, Part 2, No. 11A, (2003),L1315-L1317.

Sneh, Ofer, "Thin film atomic layer deposition equipment for semiconductor processing", *Thin Solid Films*, 402, (2002),248-261.

Suntola, T., "Atomic Layer Epitaxy", *Handbook of Crystal Growth, 3; Thin Films of Epitaxy, Part B: Growth Mechanics and Dynamics*, Amsterdam,(1994),601-663.

Suntola, Tuomo, "Atomic layer epitaxy", *Thin Solid Films*, 216(1), (Aug. 28, 1992),84-89.

Yamada, Hirotoshi, et al., "MOCVD of High-Dielectric-Constant Lanthanum Oxide Thin Films", *Journal of The Electrochemical Society*, 150(8), (Aug. 2003),G429-G435.

Zhang, H., "Atomic Layer Deposition of High Dielectric Constant Nanolaminates", *Journal of The Electrochemical Society*, 148(4), (Apr. 2001),F63-F66.

Zhang, H, et al., "High permitivity thin film nanolaminates", *Journal of Applied Physics*, 87(4), (Feb. 2000),1921-1924.

Zhong, Huicai, et al., "Electrical Properties of Ru and $RuO_2$ Gate Electrodes for Si-PMOSFET with ZrO2 and Zr-Silicate Dielectrics", *Journal of Electronic Materials*, 30(12), (Dec. 2001),1493-1498.

\* cited by examiner

RUTHENIUM LAYER FOR A DIELECTRIC LAYER CONTAINING A LANTHANIDE OXIDE

CROSS-REFERENCE TO RELATED APPLICATIONS

The present application is a divisional of application Ser. No. 10/926,812, filed Aug. 26, 2004, now U.S. Pat. No. 7,081,421, which is incorporated herein by reference in its entirety.

TECHNICAL FIELD

This application relates generally to semiconductor devices and device fabrication and, more particularly, to dielectric layers and their method of fabrication.

BACKGROUND

The semiconductor device industry has a market driven need to reduce the size of devices such as transistors. To reduce transistor size, the thickness of the silicon dioxide, $SiO_2$, gate dielectric is reduced in proportion to the shrinkage of the gate length. For example, a metal-oxide-semiconductor field effect transistor (MOSFET) would use a 1.5 nm thick $SiO_2$ gate dielectric for a gate length of 70 nm. A goal is to fabricate increasingly smaller and more reliable integrated circuits (ICs) for use in products such as processor chips, mobile telephones, and memory devices such as dynamic random access memories (DRAMs).

Currently, the semiconductor industry relies on the ability to reduce or scale the dimensions of its basic devices, primarily, the silicon based MOSFET. This device scaling includes scaling the gate dielectric, which has primarily been fabricated using silicon dioxide. A thermally grown amorphous $SiO_2$ layer provides an electrically and thermodynamically stable material, where the interface of the $SiO_2$ layer with underlying silicon provides a high quality interface as well as superior electrical isolation properties. However, increased scaling and other requirements in microelectronic devices have created the need to use other dielectric materials as gate dielectrics.

SUMMARY

The abovementioned problems are addressed by the present invention and will be understood by reading and studying the following specification. An embodiment for a method for forming an electronic device includes forming a dielectric layer containing a lanthanide oxide layer, where the lanthanide oxide layer is formed by atomic layer deposition. In various embodiments, the atomic layer deposition process uses a trisethylcyclopentadionatolanthanum precursor and/or a trisdipyvaloylmethanatolanthanum precursor. In an embodiment, a conductive layer containing ruthenium is deposited to contact the dielectric layer. Embodiments include structures for capacitors, transistors, memory devices, and electronic systems with dielectric layers containing an atomic layer deposited lanthanide oxide layer, and methods for forming such structures. These and other aspects, embodiments, advantages, and features will become apparent from the following description and the referenced drawings.

DETAILED DESCRIPTION

Figure 1:
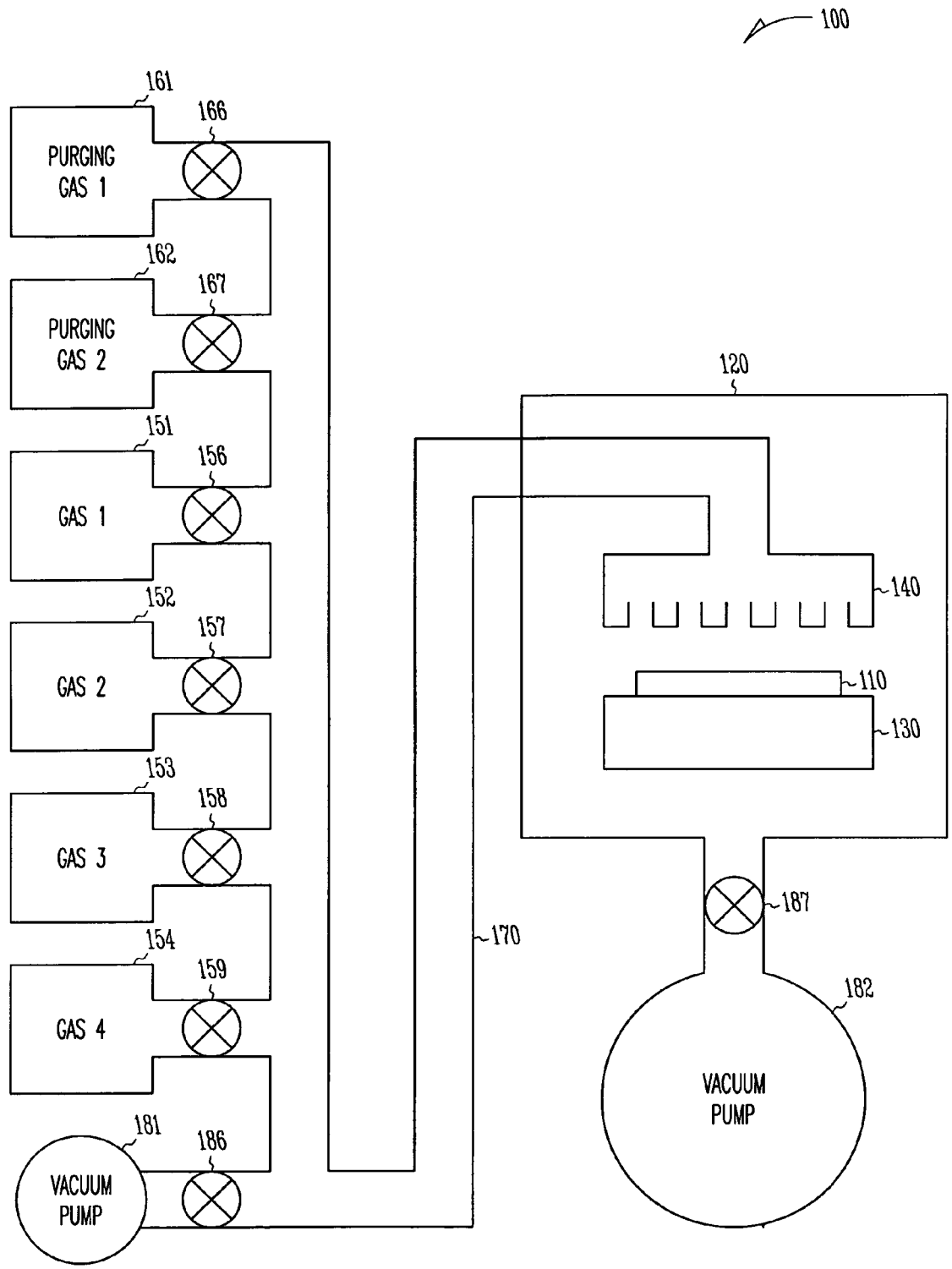
FIG. 1 depicts an atomic layer deposition system for fabricating a dielectric layer containing a lanthanide oxide layer, according to various embodiments of the present invention.

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The terms wafer and substrate used in the following description include any structure having an exposed surface with which to form an integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors or as semiconductors.

The term "horizontal" as used in this application is defined as a plane parallel to the conventional plane or surface of a wafer or substrate, regardless of the orientation of the wafer or substrate. The term "vertical" refers to a direction t perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

A gate dielectric in a transistor has both a physical gate dielectric thickness and an equivalent oxide thickness ($t_{eq}$). The equivalent oxide thickness quantifies the electrical properties, such as capacitance, of the gate dielectric in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness requirement for a $SiO_2$ layer used for a gate dielectric would be need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in typical complementary metal-oxide-semiconductor field effect transistor (CMOS) technology. Thus, future devices would be designed towards a physical $SiO_2$ gate dielectric layer of about 5 Å or less. Such a small thickness requirement for a $SiO_2$ oxide layer creates additional problems.

Silicon dioxide is used as a gate dielectric, in part, due to its electrical isolation properties in a $SiO_2$—Si based structure. This electrical isolation is due to the relatively large band gap of $SiO_2$ (8.9 eV) making it a good insulator from electrical conduction. Signification reductions in its band gap would eliminate it as a material for a gate dielectric. As the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ gate dielectric would cause an effective short between an underlying Si channel and an overlying polysilicon gate. This undesirable property sets a limit on the physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ need to be considered for use as a gate dielectric.

For a typical dielectric layer used as a gate dielectric, the capacitance is determined as one for a parallel plate capacitance: $C=\kappa\epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox}$=3.9, as $$t=(\kappa/\kappa_{ox})t_{eq}=(\kappa/3.9)t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The thinner equivalent oxide thickness required for lower transistor operating voltages and smaller transistor dimensions may be realized by a significant number of materials, but additional fabricating requirements makes determining a suitable replacement for $SiO_2$ difficult. The current view for the microelectronics industry is still for Si based devices. This requires that the gate dielectric employed be grown on a silicon substrate or silicon layer, which places significant constraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness, t, of the dielectric being formed, written as $$t_{eq}=t_{SiO2}+(\kappa_{ox}/\kappa)t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a $SiO_2$ layer, the $t_{eq}$ would be limited by the layer with the lowest dielectric constant. However, whether a single dielectric layer with a high dielectric constant or a barrier layer with a higher dielectric constant than $SiO_2$ is employed, the layer interfacing with the silicon layer must provide a high quality interface to maintain a high channel carrier mobility.

One of the advantages using $SiO_2$ as a gate dielectric has been that the formation of the $SiO_2$ layer results in an amorphous gate dielectric. Having an amorphous structure for a gate dielectric provides for reducing problems of leakage current associated with grain boundaries in polycrystalline gate dielectrics that provide high leakage paths. Additionally, grain size and orientation changes throughout a polycrystalline gate dielectric can cause variations in the film's dielectric constant, along with uniformity and surface topography problems. Typically, materials having the advantage of a high dielectric constant relative to $SiO_2$ also have the disadvantage of a crystalline form, at least in a bulk configuration. The best candidates for replacing $SiO_2$ as a gate dielectric are those with high dielectric constant, which can be fabricated as a thin layer with an amorphous form.

Candidates to replace $SiO_2$ include high-κ dielectric materials. High-κ materials include materials having a dielectric constant greater than silicon dioxide, for example, dielectrics materials having a dielectric constant greater than about twice the dielectric constant of silicon dioxide. An appropriate high-κ gate dielectric should have a large energy gap ($E_g$) and large energy barrier heights with Si for both electrons and holes. Generally, the bandgap is inversely related to the dielectric constant for a high-κ material, which lessens some advantages of the high-κ material. A set of high-κ dielectric candidates for replacing silicon oxide as the dielectric material in electronic components in integrated circuit includes the lanthanide oxides such as $La_2O_3$, $Pr_2O_3$, $Nd_2O_3$, $Sm_2O_3$, $Gd_2O_3$, $Dy_2O_3$, $Ce_2O_3$, $Tb_2O_3$, $Er_2O_3$, $Eu_2O_3$, $Lu_2O_3$, $Tm_2O_3$, $Ho_2O_3$, $Pm_2O_3$, and $Yb_2O_3$. Other candidates include lanthanide silicates. Embodiments of dielectric layers containing an atomic layer deposited lanthanide oxide layer have a larger dielectric constant than silicon dioxide. Such dielectric layers provide a significantly thinner equivalent oxide thickness compared with a silicon oxide layer having the same physical thickness. Alternately, such dielectric layers provide a significantly thicker physical thickness than a silicon oxide layer having the same equivalent oxide thickness. This increased physical thickness aids in reducing leakage current.

In an embodiment, a lanthanide oxide layer is formed in an integrated circuit by atomic layer deposition using a trisethylcyclopentadionatolanthanum precursor. In an embodiment, a lanthanide oxide layer is formed in an integrated circuit by atomic layer deposition using a trisdipyvaloylmethanatolanthanum precursor. In an embodiment, the lanthanide oxide layer may be formed substantially as a lanthanum oxide layer. In an embodiment, a lanthanide oxide layer may be formed as a combination of layers having at least one lanthanum oxide layer along with layers of one or more other lanthanide oxides. Alternately, a lanthanide oxide layer may be formed as a combination of lanthanum oxide and other lanthanide oxides in which the lanthanide oxides are configured throughout the lanthanide oxide layer without restriction to layers of the individual lanthanide oxides.

However, lanthanide oxide dielectrics on a silicon substrate tend to lead to large flatband voltage shifts, which may be attributed to fixed oxide charges located near the interface between the lanthanide oxide layer and the silicon. The source of this fixed oxide charge may be due to an interface reaction of a metal gate, such as aluminum, with the lanthanide oxide on which the metal gate is disposed. This metal gate interface reaction may induce a portion of the fixed oxide charges.

In an embodiment, a ruthenium metal layer is disposed on the lanthanide oxide layer as an electrode, gate, or direct conductive contact depending on the application of the lanthanide oxide dielectric as a component of an electronic device in an integrated circuit. A ruthenium metal layer, such as for a gate metal, is used to avoid or prevent a reaction between the gate metal and the lanthanide oxide layer. Generally, ruthenium is more inert than polysilicon and metals such as aluminum and tantalum, has a resistivity as low as 7.5 μΩcm, and has a melting point of 2450° C. The ruthenium metal layer may be deposited by a physical vapor deposition, evaporation, sputtering, chemical vapor deposition, and metalorganic chemical vapor deposition. The ruthenium metal layer may be shaped by reactive ion etching. The ruthenium gate contacting an atomic layer deposited lanthanide oxide dielectric layer may be applied to fabrication processes of Damascene gate and dual gate MOSFETs.

In an embodiment, a conductive ruthenium oxide layer is disposed on the lanthanide oxide layer as an electrode, gate, or direct conductive contact depending on the application of the lanthanide oxide dielectric as a component of an electronic device in an integrated circuit. $RuO_2$ like ruthenium has a large work function in the range of approximately 5 eV, low resistivity, and good thermal stability. A layer of ruthenium oxide may be formed on a lanthanide oxide layer in an integrated circuit using techniques such as a physical vapor deposition, evaporation, sputtering, chemical vapor deposition, and metalorganic chemical vapor deposition.

Another consideration for selecting the material and method for forming a dielectric film for use in electronic devices and systems concerns the roughness of a dielectric film on a substrate. Surface roughness of the dielectric film has a significant effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High energy impacts remove body region particles creating pits. The surface of such a deposited layer can have a rough contour due to the rough interface at the body region.

In an embodiment, a lanthanide oxide dielectric film having a substantially smooth surface relative to other processing techniques is formed using atomic layer deposition (ALD). Further, forming such a dielectric film using atomic layer deposition can provide for controlling transitions between material layers. As a result of such control, atomic layer deposited lanthanide oxide dielectric films can have an engineered transition with a substrate surface.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber is purged with a gas, which in many cases is an inert gas, and/or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other on the substrate aggressively, one ALD cycle can be preformed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

ALD was originally developed to manufacture luminescent and dielectric films needed in electroluminescent displays. Significant efforts have been made to apply ALD to the growth of doped zinc sulfide and alkaline earth metal sulfide films. Additionally, ALD has been studied for the growth of different epitaxial II-V and II-VI films, nonepitaxial crystalline or amorphous oxide and nitride films and multilayer structures of these. There also has been considerable interest towards the ALD growth of silicon and germanium films, but due to the difficult precursor chemistry, this has not been very successful.

The precursors used in an ALD process may be gaseous, liquid or solid. However, liquid or solid precursors should be volatile. The vapor pressure should be high enough for effective mass transportation. In addition, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used though evaporation rates may somewhat vary during the process because of changes in their surface area.

There are several other characteristics for precursors used in ALD. The precursors should be thermally stable at the substrate temperature because their decomposition would destroy the surface control and accordingly the advantages of the ALD method that relies on the reaction of the precursor at the substrate surface. A slight decomposition, if slow compared to the ALD growth, can be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

The advantages of RS-ALD include continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with resolution of one to two monolayers. RS-ALD processes allows for deposition control on the order on monolayers and the ability to deposit monolayers of amorphous films.

Herein, a sequence refers to the ALD material formation based on an ALD reaction of a precursor followed by its reactant precursor. For example, forming lanthanum oxide from a La(thd)$_3$ (thd=2,2,6,6-tetramethl-3,5-heptanedione) precursor and ozone, as its reactant precursor, forms an embodiment of a lanthanum/oxygen sequence, which can also be referred to as lanthanum sequence. A cycle of a sequence includes pulsing a precursor, pulsing a purging gas for the precursor, pulsing a reactant precursor, and pulsing the reactant's purging gas.

In an embodiment, a layer of lanthanum oxide is formed on a substrate mounted in a reaction chamber using ALD in a repetitive sequence using precursor gases individually pulsed into the reaction chamber. An embodiment includes forming the lanthanum oxide using a trisethylcyclopentadionato-lanthanum precursor gas. Alternately, the lanthanide oxide layer may be formed by atomic layer deposition using a trisdipyvaloylmethanatolanthanum precursor gas. Other solid or liquid precursors may be used in an appropriately designed reaction chamber.

FIG. 1 shows an embodiment of an atomic layer deposition system 100 for processing a dielectric film containing lanthanide oxide. The elements depicted permit discussion of the present invention such that those skilled in the art may practice the present invention without undue experimentation. In FIG. 1, a substrate 110 is located inside a reaction chamber 120 of ALD system 100. Also located within the reaction chamber 120 is a heating element 130, which is thermally coupled to substrate 110 to control the substrate temperature. A gas-distribution fixture 140 introduces precursor gases to the substrate 110. Each precursor gas originates from individual gas sources 151-154, whose flow is controlled by mass-flow controllers 156-159, respectively. Gas sources 151-154 provide a precursor gas either by storing the precursor as a gas or by providing a location and apparatus for evaporating a solid or liquid material to form the selected precursor gas.

Also included in the ALD system are purging gas sources 161, 162, each of which is coupled to mass-flow controllers 166, 167, respectively. Furthermore, additional purging gas sources can be constructed in ALD system 100, one purging gas source for each precursor gas, for example. For a process that uses the same purging gas for multiple precursor gases less purging gas sources are required for ALD system 100. Gas sources 151-154 and purging gas sources 161-162 are coupled by their associated mass-flow controllers to a common gas line or conduit 170, which is coupled to the gas-distribution fixture 140 inside the reaction chamber 120. Gas conduit 170 is also coupled to vacuum pump, or exhaust pump, 181 by mass-flow controller 186 to remove excess precursor gases, purging gases, and by-product gases at the end of a purging sequence from the gas conduit.

Vacuum pump, or exhaust pump, 182 is coupled by mass-flow controller 187 to remove excess precursor gases, purging gases, and by-product gases at the end of a purging sequence from reaction chamber 120. For convenience, control displays, mounting apparatus, temperature sensing devices, substrate maneuvering apparatus, and necessary electrical connections as are known to those skilled in the art are not shown in FIG. 1. Though ALD system 100 is well suited for practicing the present invention, other ALD systems commercially available can be used.

The use, construction and fundamental operation of reaction chambers for deposition of films are understood by those of ordinary skill in the art of semiconductor fabrication. The present invention may be practiced on a variety of such reaction chambers without undue experimentation. Furthermore, one of ordinary skill in the art will comprehend the necessary detection, measurement, and control techniques in the art of semiconductor fabrication upon reading the disclosure.

The elements of ALD system 100 can be controlled by a computer. To focus on the use of ALD system 100 in the various embodiments of the present invention, the computer is not shown. Those skilled in the art can appreciate that the individual elements such as pressure control, temperature control, and gas flow within ALD system 100 can be under computer control.

Figure 2:
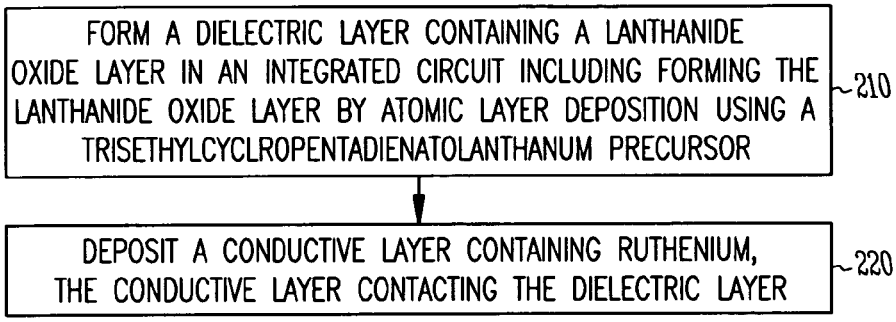
FIG. 2 illustrates a flow diagram of elements for an embodiment of a method to form a dielectric layer containing a lanthanide oxide layer by atomic layer deposition and a conductive layer contacting the dielectric layer, where the conductive layer contains ruthenium, according to various embodiments of the present invention.

FIG. 2 illustrates a flow diagram of elements for an embodiment of a method to form a dielectric layer containing a lanthanide oxide layer and a conductive layer contacting the dielectric layer, where the conductive layer contains ruthenium. At 210, a dielectric layer is forming containing a lanthanide oxide layer in an integrated circuit. The lanthanide oxide layer may include lanthanum oxide. In an embodiment, the lanthanum oxide is $La_2O_3$. Alternately, the lanthanum oxide formed may include non-stoichiometric forms of lanthanum oxide. The term, La-oxide, is used to include stoichiometric lanthanum oxide, non-stoichiometric, and compositions having stoichiometric and non-stoichiometric lanthanum oxide. In an embodiment, a La-oxide layer is formed by atomic layer deposition using a trisethylcyclopentadionatolanthanum $(La(EtCp)_3)$ precursor gas. Alternately, a La-oxide layer may be formed by atomic layer deposition using a trisdipyvaloylmethanatolanthanum $(La(DPM)_3)$ precursor gas. A number of precursors containing lanthanum may be used to deposit the lanthanum on a substrate for the integrated circuit. In addition, the pulsing of the lanthanum precursor may use a pulsing period that provides uniform coverage of a monolayer on the surface or may use a pulsing period that provides partial formation of a monolayer on the surface.

In an embodiment, the dielectric layer may be formed substantially as a lanthanide oxide layer. The lanthanide oxide layer may be formed substantially as a La-oxide layer. In an embodiment, a lanthanide oxide layer may be formed as a combination of layers having at least one La-oxide layer along with layers of other lanthanide oxides. Alternately, a lanthanide oxide layer may be formed as a combination of La-oxide and other lanthanide oxides in which the lanthanide oxides are configured throughout the lanthanide oxide layer without restriction to layers of the individual lanthanide oxides.

At 220, a conductive layer containing ruthenium is deposited such that the conductive layer contacts the dielectric layer. The conductive layer may be used in various embodiments as electrodes, gates, and direct contacts to the dielectric layer containing the atomic layer deposited lanthanide oxide for a wide variety of electronic devices. In an embodiment, the conductive layer may be formed substantially as a ruthenium metal layer. Alternately, the conductive layer may be formed substantially as a conductive ruthenium oxide layer. The conductive ruthenium oxide formed may be stoichiometric and/or non-stoichiometric.

Figure 3:
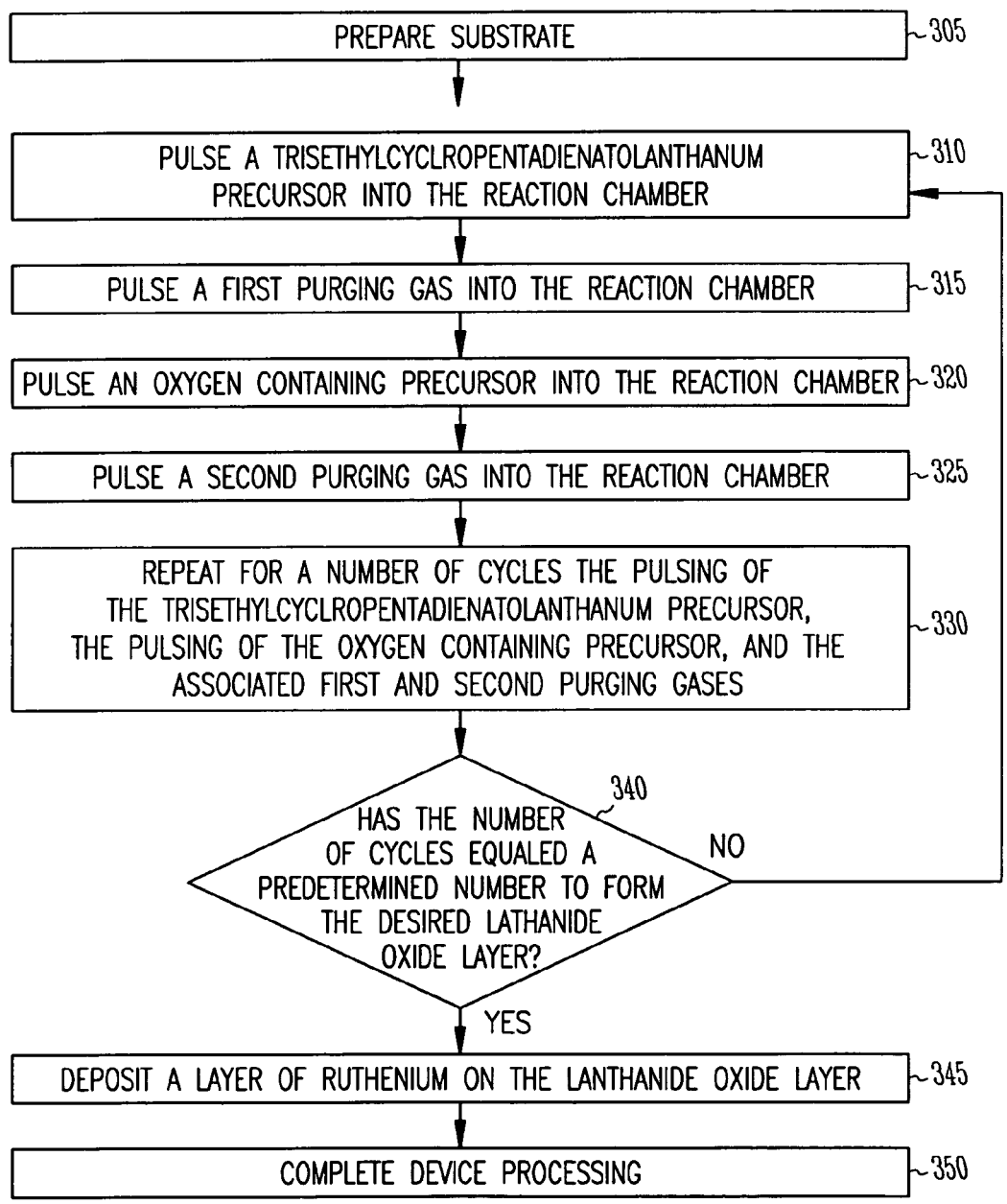
FIG. 3 illustrates a flow diagram of elements for an embodiment of a method to form a dielectric layer containing a lanthanide oxide layer by atomic layer deposition and a conductive layer contacting the dielectric layer, where the conductive layer contains ruthenium, according to the present invention.

FIG. 3 illustrates a flow diagram of elements for an embodiment of a method to form a dielectric layer containing an atomic layer deposited lanthanide oxide layer and a conductive layer contacting the dielectric layer, where the conductive layer contains ruthenium. This embodiment can be implemented with the atomic layer deposition system 100 of FIG. 1. At 305, a substrate 110 is prepared. The substrate used for forming a transistor is typically a silicon or silicon containing material. In other embodiments, germanium, gallium arsenide, silicon-on-sapphire substrates, or other suitable substrates may be used. This preparation process includes cleaning substrate 110 and forming layers and regions of the substrate, such as drains and sources of a metal oxide semiconductor (MOS) transistor, prior to forming a gate dielectric. In an embodiment, the substrate is cleaned to provide an initial substrate depleted of its native oxide. In an embodiment, the initial substrate is cleaned also to provide a hydrogen-terminated surface. In an embodiment, a silicon substrate undergoes a final hydrofluoric (HF) rinse prior to ALD processing to provide the silicon substrate with a hydrogen-terminated surface without a native silicon oxide layer.

Cleaning immediately preceding atomic layer deposition aids in reducing an occurrence of silicon oxide as an interface between a silicon based substrate and a lanthanide oxide dielectric formed using the atomic layer deposition process. The material composition and its properties of an interface layer are typically dependent on process conditions and the condition of the substrate before forming the dielectric layer. Though the existence of an interface layer may effectively reduce the dielectric constant associated with the dielectric layer and its substrate interface layer, a $SiO_2$ interface layer or other composition interface layer, may improve the interface density, fixed charge density, and channel mobility of a device having this interface layer.

The sequencing of the formation of the regions of the transistor being processed may follow typical sequencing that is generally performed in the fabrication of a MOS transistor as is well known to those skilled in the art. Included in the processing prior to forming a gate dielectric is the masking of substrate regions to be protected during the gate dielectric formation, as is typically performed in MOS fabrication. In this embodiment, the unmasked region includes a body region of a transistor, however one skilled in the art will recognize that other semiconductor device structures may utilize this process. Additionally, the substrate 110 in its ready for processing form is conveyed into a position in reaction chamber 120 for ALD processing.

At 310, a lanthanum containing precursor such as a $La(EtCp)_3$ precursor is pulsed into reaction chamber 120. The $La(EtCp)_3$ is pulsed into reaction chamber 120 through the gas-distribution fixture 140 onto substrate 110. The flow of the $La(EtCp)_3$ is controlled by mass-flow controller 156 from gas source 151, where the $La(EtCp)_3$ is maintained. In an embodiment, the substrate temperature is maintained at temperature ranging from about 400° C. to about 650° C. In an embodiment, the substrate temperature is maintained at about 650° C. Alternately, the substrate temperature may be maintained at temperatures less than 650° C. by heating element 130. The $La(EtCp)_3$ reacts with the surface of the substrate 110 in the desired region defined by the unmasked areas of the substrate 110. In other embodiments, $La(DPM)_3$ is used as a lanthanum containing precursor. In an embodiment, $H_2$ is pulsed along with the $La(EtCp)_3$ precursor or the $La(DPM)_3$ precursor to reduce carbon contamination in the deposited film. $La(EtCp)_3$ has a melting point of about 95° C. and has a vapor pressure that is significantly higher than the vapor pressure of $La(DPM)_3$. The use of $La(EtCp)_3$ and/or $La(DPM)_3$ as the lanthanum containing precursor may depend on the application of the electronic device being fabricated.

At 315, a first purging gas is pulsed into the reaction chamber 120. In an embodiment, nitrogen is used as a purging gas and a carrier gas. The nitrogen flow is controlled by mass-flow controller 166 from the purging gas source 161 into the gas conduit 170. Using the pure nitrogen purge avoids overlap of the precursor pulses and possible gas phase reactions. In an embodiment, argon gas or other inert gas may be used as the purging gas. Following the purge, an oxygen containing precursor is pulsed into the reaction chamber 120, at 320.

For the lanthanum sequence using La(EtCp)$_3$ or La(DPM)$_3$ as the precursor, water vapor may be selected as the precursor acting as a reactant to form La-oxide on the substrate 110. The H$_2$O vapor is pulsed into the reaction chamber 120 through gas conduit 170 from gas source 152 by mass-flow controller 157. The water vapor aggressively reacts at the surface of substrate 110.

Following the pulsing of an oxygen containing precursor, a second purging gas is injected into the reaction chamber 120, at 325. Nitrogen gas may be used to purge the reaction chamber after pulsing each precursor gas in the lanthanum/oxygen sequence. In an embodiment, argon gas or other inert gas may be used as the purging gas. Excess precursor gas, and reaction by-products are removed from the system by the purge gas in conjunction with the exhausting of the reaction chamber 120 using vacuum pump 182 through mass-flow controller 187, and exhausting of the gas conduit 170 by the vacuum pump 181 through mass-flow controller 186.

At 330, the pulsing of the La(EtCp)$_3$ precursor, the pulsing of the oxygen containing precursor, and the pulsing of the first and second purging gas are repeated for a number of cycles. After repeating the lanthanum/oxygen sequence for a selected number of cycles, at 340, a determination is made as to whether the number of lanthanum cycles equals a predetermined number to form the desired lanthanide oxide layer. If the total number of cycles to form the desired thickness has not been completed, a number of cycles for the lanthanum/oxygen sequence is repeated, beginning again at 310, and the process continues. If the total number of cycles to form the desired thickness has been completed, the dielectric film containing the lanthanide oxide layer may optionally be annealed. The lanthanide oxide layer processed at these relatively low temperatures may provide an amorphous layer.

The thickness of a lanthanide oxide layer formed by atomic layer deposition is determined by a fixed growth rate for the pulsing periods and precursors used, set at a value such as N nm/cycle, dependent upon the number of cycles of the lanthanum sequence. For a desired lanthanide oxide layer thickness, t, in an application such as forming a gate dielectric of a MOS transistor, the ALD process is repeated for t/N total cycles. Once the t/N cycles have completed, no further ALD processing for the lanthanide oxide layer is required.

At 345, a conductive layer containing ruthenium is deposited on the lanthanide oxide layer. The conductive layer may be deposited as a layer of ruthenium. Ruthenium may be deposited using a number of techniques including, but not limited to, evaporation, sputtering, chemical vapor deposition (CVD), and metalorganic chemical vapor deposition (MOCVD). The ruthenium layer may be shaped by reactive ion etching (RIE) in a gas ambient having a CHF$_3$+O$_2$ mixture. Such metal layer shaping may be used to form a Ru gate in metal oxide semiconductor field transistors (MOSFETs). Alternately, the conductive layer may be formed as a layer of conductive ruthenium oxide. Ruthenium oxide may be formed using a number of techniques including, but not limited to, evaporation, sputtering, chemical vapor deposition (CVD), and metalorganic chemical vapor deposition (MOCVD).

At 350, after forming the lanthanide oxide layer, processing the device having the dielectric layer containing lanthanide oxide layer is completed. In an embodiment, completing the device includes completing the formation of a transistor. In another embodiment, completing the device includes completing the formation of a capacitor. Alternately, completing the process includes completing the construction of a memory device having an array with access transistors formed with gate dielectrics containing atomic layer deposited lanthanide oxide layer. Metallizations formed in further processing of the device may be annealed in a high-purity H$_2$ ambient at about 400° C. Such post metallization annealing provides a means to reduce interface state density in the device having a structure with a La-oxide dielectric layer contacting a ruthenium layer. Further, in another embodiment, completing the process includes the formation of an electronic system including an information handling device that uses electronic devices with transistors formed with dielectric films containing an atomic layer deposited lanthanide oxide layer. Typically, information handling devices such as computers include many memory devices, having many access transistors.

Embodiments for methods having elements similar to the embodiment of FIG. 3 may include numerous permutations for forming the lanthanide oxide layer. In an embodiment, the lanthanide oxide layer includes substantially lanthanum oxide. In another embodiment, a lanthanide oxide layer includes two or more layers of lanthanide oxides in which at least one of the layers is a La-oxide layer. The other layers may include one or more oxides of lanthanides Pr, N, Sm, Gd, Dy, Ce, Tb, Er, Eu, Lu, Tm, Ho, Pm, and Yb, with the lanthanide oxides in stoichiometric form or in non-stoichiometric form. The lanthanide layer may include stoichiometric lanthanide oxides and non-stoichiometric lanthanide oxides. In an embodiment, a dielectric layer containing a lanthanide oxide may include dielectric layers of non-lanthanide oxides. In an embodiment, a dielectric layer contains a lanthanide oxide and a non-lanthanide oxide in which contact to a conductive layer containing ruthenium is configured with the lanthanum oxide layer contacting the conductive layer. The conductive layer may be formed substantially of ruthenium. Alternately, the conductive layer may be formed substantially of conductive ruthenium oxide.

The embodiments described herein provide a process for growing a dielectric film having a wide range of useful equivalent oxide thickness, $t_{eq}$, associated with a dielectric constant in the range from about 11 to about 30. This range of dielectric constants provides for a $t_{eq}$ ranging from about 13% to about 36% relative to a given silicon dioxide thickness. In an embodiment, a dielectric layer containing a lanthanide oxide layer has a $t_{eq}$ ranging from about 5 Å to about 20 Å. In an embodiment, a dielectric layer containing a lanthanide oxide layer has a $t_{eq}$ of less than 5 Å. Alternately, for an acceptable silicon dioxide thickness, an embodiment for a lanthanide oxide may be from less than three to less than eight larger than the acceptable silicon dioxide thickness providing enhanced probability for reducing leakage current. Further, dielectric films of lanthanide oxide layer formed by atomic layer deposition can provide not only thin $t_{eq}$ films, but also films with relatively low leakage current. Additionally, the novel process can be implemented to form transistors, capacitors, memory devices, and other electronic systems including information handling devices.

Figure 4:
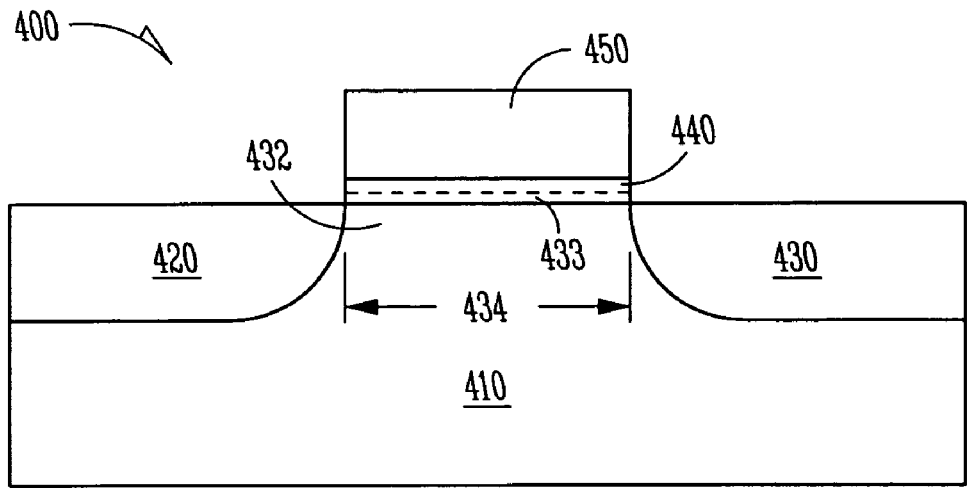
FIG. 4 shows an embodiment of a configuration of a transistor having a dielectric layer containing an atomic layer deposited lanthanide oxide layer, according to the present invention.

A transistor 400 as depicted in FIG. 4 may be constructed by forming a source region 420 and a drain region 430 in a silicon based substrate 410 where source and drain regions 420, 430 are separated by a body region 432. Body region 432 defines a channel having a channel length 434. A dielectric layer is disposed on substrate 410 formed as a layer containing lanthanide oxide on substrate 410 by atomic layer deposition. The resulting dielectric layer forms gate dielectric 440. Gate dielectric 440 may be realized as a dielectric layer formed substantially of lanthanide oxide. Gate dielectric 440 may be lanthanide oxide layer containing one or more layers of lanthanide oxides in which at least one layer is lanthanum oxide.

A gate 450 is formed over and contacts gate dielectric 440. In an embodiment, gate 450 contains ruthenium. In an embodiment, gate 450 is formed substantially of a ruthenium metal. Alternately, gate 450 is formed substantially of conductive ruthenium oxide.

An interfacial layer 433 may form between body region 432 and gate dielectric 440. In an embodiment, interfacial layer 433 may be limited to a relatively small thickness compared to gate dielectric 440, or to a thickness significantly less than gate dielectric 440 as to be effectively eliminated. Forming the substrate, and the source and drain regions may be performed using standard processes known to those skilled in the art. Additionally, the sequencing of the various elements of the process for forming a transistor may be conducted with standard fabrication processes, also as known to those skilled in the art. In an embodiment, gate dielectric 440 may be realized as a gate insulator in a silicon CMOS transistor. Use of a gate dielectric containing lanthanide oxide contacted by a conductive layer containing ruthenium is not limited to silicon based substrates, but may be used with a variety of semiconductor substrates.

Figure 5:
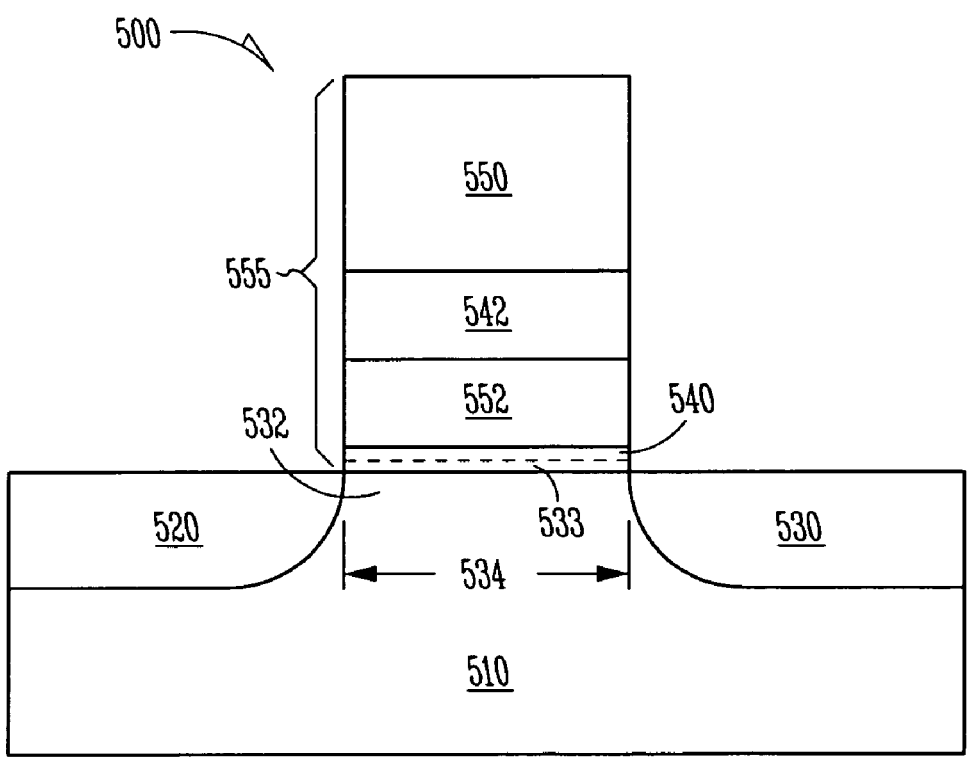
FIG. 5 shows an embodiment of a configuration of a floating gate transistor having a dielectric layer containing an atomic layer deposited lanthanide oxide layer, according to the present invention.

FIG. 5 shows an embodiment of a configuration of a transistor 500 having an atomic layer deposited lanthanide oxide layer dielectric film. Transistor 500 includes a silicon based substrate 510 with a source 520 and a drain 530 separated by a body region 532. Body region 532 between source 520 and drain 530 defines a channel region having a channel length 534. Located above body region 532 is a stack 555 including a gate dielectric 540, a floating gate 552, a floating gate dielectric 542, and a control gate 550. An interfacial layer 533 may form between body region 532 and gate dielectric 540. In an embodiment, interfacial layer 533 may be limited to a relatively small thickness compared to gate dielectric 540, or to a thickness significantly less than gate dielectric 540 as to be effectively eliminated.

Gate dielectric 540 includes a dielectric containing an atomic layer deposited lanthanide oxide layer formed in embodiments similar to those described herein. Gate dielectric 540 may be realized as a dielectric layer formed substantially of lanthanide oxide. Gate dielectric 540 may be a lanthanide oxide layer containing one or more layers of lanthanide oxides in which at least one layer is substantially lanthanum oxide. In an embodiment, floating gate 552 is formed over and contacts gate dielectric 540. Floating gate 552 contains ruthenium. In an embodiment, floating gate 552 is formed substantially of a ruthenium metal. Alternately, floating gate 552 is formed substantially of conductive ruthenium oxide.

In an embodiment, floating gate dielectric 542 includes a dielectric containing an atomic layer deposited lanthanide oxide layer formed in embodiments similar to those described herein. Floating gate dielectric 542 may be realized as a dielectric layer formed substantially of lanthanide oxide. Floating gate dielectric 542 may be lanthanide oxide layer containing one or more layers of lanthanide oxides in which at least one layer is substantially lanthanum oxide. In an embodiment, control gate 550 is formed over and contacts floating gate dielectric 542. Control gate 550 contains ruthenium. In an embodiment, control gate 550 is formed substantially of a ruthenium metal. Alternately, control gate 550 is formed substantially of conductive ruthenium oxide.

Alternately, both gate dielectric 540 and floating gate dielectric 542 may be formed as dielectric layers containing an atomic layer deposited lanthanide oxide layer. In such embodiments, control gate 550 and/or floating gate 552 may be formed containing ruthenium. In an embodiment, control gate 550 and/or floating gate 552 are formed substantially of a ruthenium metal. Alternately, control gate 550 and/or floating gate 552 are formed substantially of conductive ruthenium oxide. Floating gate 552, control gate 550, gate dielectric 540, and floating gate dielectric 542 may be realized by embodiments similar to those described herein with the remaining elements of the transistor 500 formed using processes known to those skilled in the art.

In an embodiment, gate dielectric 540 forms a tunnel gate insulator and floating gate dielectric 542 forms an inter-gate insulator in flash memory devices, where gate dielectric 540 and/or floating gate dielectric 542 include an atomic layer deposited lanthanide oxide film. Use of dielectric layers containing an atomic layer deposited lanthanide oxide layer for a gate dielectric and/or floating gate dielectric in which the dielectric layer contacts a conductive layer containing ruthenium is not limited to silicon based substrates, but may be used with a variety of semiconductor substrates.

Figure 6:
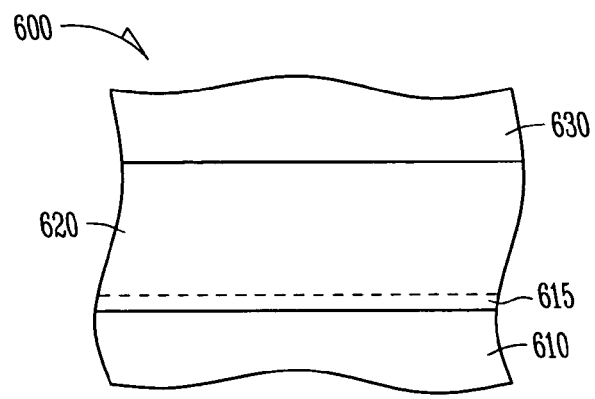
FIG. 6 shows an embodiment of a configuration of a capacitor having a dielectric layer containing an atomic layer deposited lanthanide oxide layer, according to the present invention.

The embodiments of methods for forming dielectric layers containing an atomic layer deposited lanthanide oxide layer in which the dielectric layer contacts a conductive layer containing ruthenium may also be applied to forming capacitors in various integrated circuits, memory devices, and electronic systems. In an embodiment for forming a capacitor 600 illustrated in FIG. 6, a method includes forming a first conductive layer 610, forming a dielectric layer 620 containing an atomic layer deposited lanthanide oxide layer on first conductive layer 610, and forming a second conductive layer 630 on dielectric layer 620. Dielectric layer 620 containing lanthanide oxide layer may be formed using any of the embodiments described herein. An interfacial layer 615 may form between first conductive layer 610 and dielectric layer 620. In an embodiment, interfacial layer 615 may be limited to a relatively small thickness compared to dielectric layer 620, or to a thickness significantly less than dielectric layer 620 as to be effectively eliminated.

Dielectric layer 620 may be realized as a dielectric layer formed substantially of lanthanide oxide. Dielectric layer 620 may be a lanthanide oxide layer containing one or more layers of lanthanide oxides in which at least one layer is substantially lanthanum oxide. In an embodiment, second conductive layer 630 and/or first conductive layer 610 contain ruthenium. In an embodiment, second conductive layer 630 and/or first conductive layer 610 are formed substantially of a ruthenium metal. Alternately, second conductive layer 630 and/or first conductive layer 610 are formed substantially of conductive ruthenium oxide. Embodiments for dielectric layer 620 containing an atomic layer deposited lanthanide oxide layer in a capacitor includes, but is not limited to, dielectrics in DRAM capacitors and dielectrics in capacitors in analog, radio frequency (RF), and mixed signal integrated circuits.

Various embodiments for a dielectric film containing atomic layer deposited lanthanide oxide may provide for enhanced device performance by providing devices with reduced leakage current. Such improvements in leakage current characteristics may be attained by forming one or more layers of an atomic layer deposited lanthanide oxide in a nanolaminate structure with other metal oxides including other lanthanide oxides and/or with other non-metal containing dielectrics. The transition from one layer of the nanolaminate to another layer of the nanolaminate provides further disruption to a tendency for an ordered structure in the nanolaminate stack. The term "nanolaminate" means a composite film of ultra thin layers of two or more materials in a layered stack, where the layers are alternating layers of materials of the composite film. Typically, each layer in a nanolaminate has a thickness of an order of magnitude in the nanometer range. Further, each individual material layer of the nanolaminate can have a thickness as low as a monolayer of the material or as high as 20 nanometers. In an embodiment, a La-oxide/Pr-oxide nanolaminate contains alternating layers of a lanthanum oxide and a praseodymium oxide.

Figure 7:
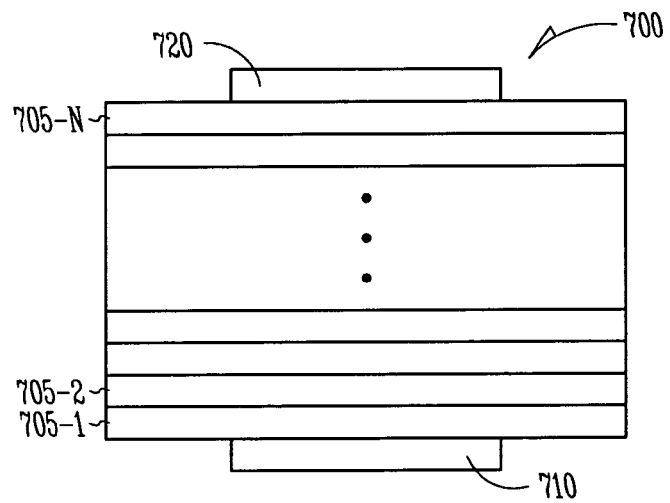
FIG. 7 depicts an embodiment of a dielectric layer including a nanolaminate having at least one layer containing an atomic layer deposited lanthanide oxide layer, according to the present invention.

FIG. 7 depicts a nanolaminate structure 700 for an embodiment of a dielectric structure including an atomic layer deposited lanthanide oxide layer dielectric film. Nanolaminate structure 700 includes a plurality of layers 705-1, 705-2 to 705-N, where at least one layer contains a lanthanide oxide layer formed by atomic layer deposition using a trisethylcyclopentadionatolanthanum precursor or a trisdipyvaloylmethanatolanthanum precursor. The other layers may be other dielectric layers or dielectric metal oxides including oxides of lanthanides Pr, Nd, Sm, Gd, Dy, Ce, Tb, Er, Eu, Lu, Tm, Ho, Pm, and/or Yb in stoichiometric form or in non-stoichiometric form. The sequencing of the layers depends on the application. The effective dielectric constant associated with nanolaminate structure 700 is that attributable to N capacitors in series, where each capacitor has a thickness defined by the thickness of the corresponding layer. By selecting each thickness and the composition of each layer, a nanolaminate structure can be engineered to have a predetermined dielectric constant.

In an embodiment, nanolaminate structure 700 contains conductive contacts 710 and 720. Conductive contacts 720 and/or 710 may be conductive layers containing ruthenium. In an embodiment, contacts 720 and/or 710 are conductive layers formed substantially of a ruthenium metal. Alternately, contacts 720 and/or 710 are conductive layers formed substantially of conductive ruthenium oxide. In an embodiment, conductive contacts 720 and/or 710 containing ruthenium contact layers 705-N and 705-1, respectively, where at least one of layers 705-1 and 705-N includes an atomic layer deposited lanthanide oxide layer. Embodiments for structures such as nanolaminate structure 700 may be used as nanolaminate dielectrics in NROM flash memory devices as well as other integrated circuits.

Transistors, capacitors, and other devices having dielectric films containing atomic layer deposited lanthanide oxide layer formed by the methods described above may be implemented into memory devices and electronic systems including information handling devices. Embodiments of these information handling devices may include wireless systems, telecommunication systems, and computers. Further, embodiments of electronic devices having dielectric films containing an atomic layer deposited lanthanide oxide layer may be realized as integrated circuits.

Figure 8:
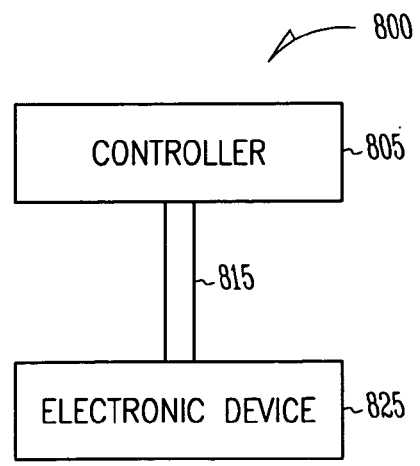
FIG. 8 is a simplified diagram for an embodiment of a controller coupled to an electronic device, according to the present invention.

FIG. 8 illustrates a diagram for an electronic system 800 having one or more devices having a dielectric layer containing an atomic layer deposited lanthanide oxide layer formed according to various embodiments of the present invention. Electronic system 800 includes a controller 805, a bus 815, and an electronic device 825, where bus 815 provides electrical conductivity between controller 805 and electronic device 825. In various embodiments, controller 805 and/or electronic device 825 include an embodiment for a dielectric layer containing an atomic layer deposited lanthanide oxide layer as previously discussed herein. Such dielectric layers may be in contact with conductive layers containing ruthenium. Electronic system 800 may include, but is not limited to, information handling devices, wireless systems, telecommunication systems, fiber optic systems, electro-optic systems, and computers.

Figure 9:
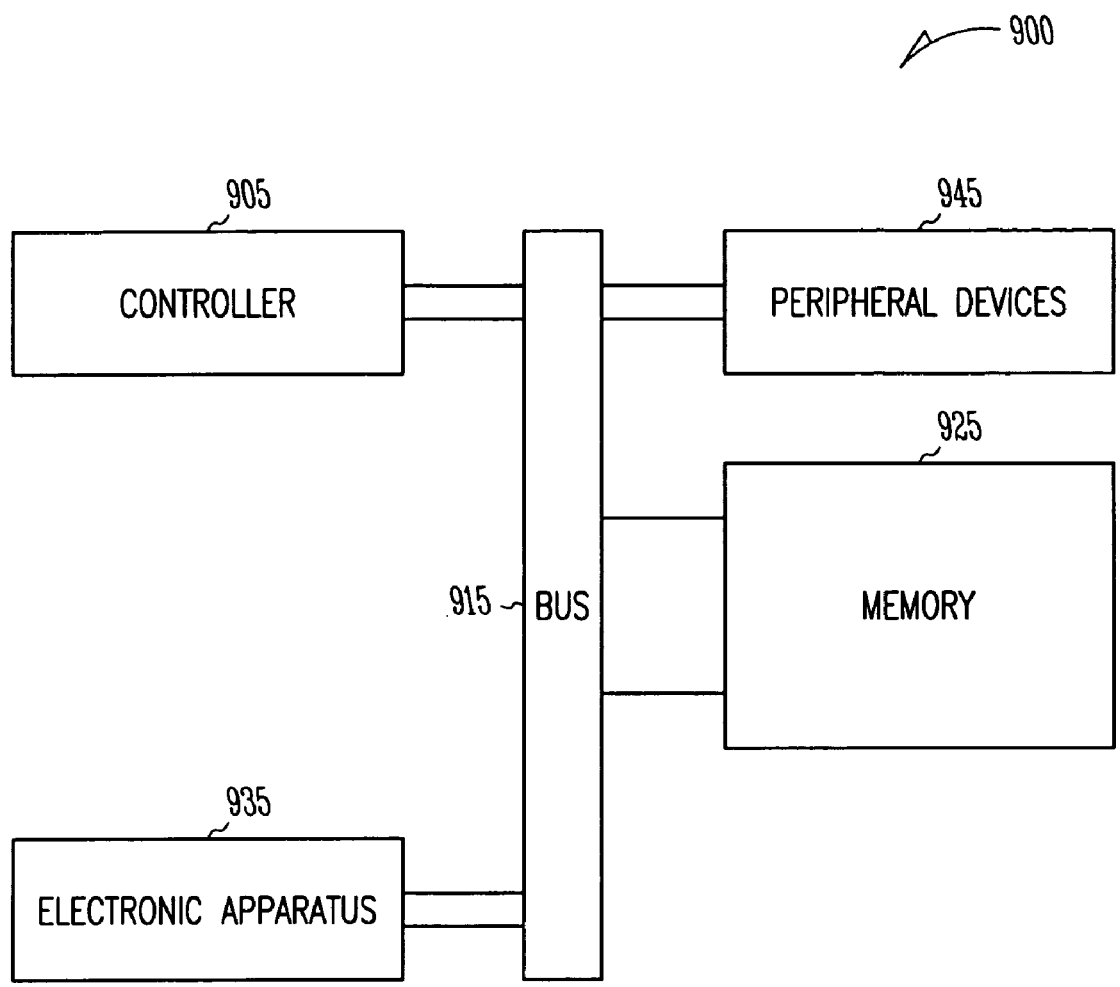
FIG. 9 illustrates a diagram for an embodiment of an electronic system having devices with a dielectric film containing an atomic layer deposited lanthanide oxide layer, according to the present invention.

FIG. 9 depicts a diagram of an embodiment of a system 900 having a controller 905 and a memory 925. Controller 905 and/or memory 925 may include a dielectric layer having an atomic layer deposited lanthanide oxide layer. Such dielectric layers may be in contact with conductive layers containing ruthenium. System 900 also includes an electronic apparatus 935, and a bus 915, where bus 915 provides electrical conductivity between controller 905 and electronic apparatus 935, and between controller 905 and memory 925. Bus 915 may include an address, a data bus, and a control bus, each independently configured. Alternately, bus 915 may use common conductive lines for providing address, data, and/or control, the use of which is regulated by controller 905. In an embodiment, electronic apparatus 935 may be additional memory configured similar as memory 925. An embodiment may include an additional peripheral device or devices 945 coupled to bus 915. In an embodiment controller 905 is a processor. Any of controller 905, memory 925, bus 915, electronic apparatus 935, and peripheral device devices 945 may include a dielectric layer having an atomic layer deposited lanthanide oxide layer. Such dielectric layers may be in contact with conductive layers containing ruthenium. System 900 may include, but is not limited to, information handling devices, telecommunication systems, and computers.

Peripheral devices 945 may include displays, additional storage memory, or other control devices that may operate in conjunction with controller 905. Alternately, peripheral devices 945 may include displays, additional storage memory, or other control devices that may operate in conjunction with controller 905 and/or memory 925.

Memory 925 may be realized as a memory device containing an atomic layer deposited lanthanide oxide layer. Such dielectric layers may be in contact with conductive layers containing ruthenium. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Formation of lanthanide oxide layers by an atomic layer deposition can be realized using a trisethylcyclopentadionatolanthanum precursor and/or a trisdipyvaloylmethanatolanthanum precursor. Further, lanthanide oxide films formed by atomic layer deposition processed in relatively low temperatures can be amorphous and possess smooth surfaces. Such lanthanide oxide films can provide enhanced electrical properties due to their smoother surface resulting in reduced leakage current. Additionally, such dielectric layers provide a significantly thicker physical thickness than a silicon oxide layer having the same equivalent oxide thickness, where the increased thickness would also reduce leakage current. These properties of layers containing atomic layer deposited lanthanide oxide films allow for application as dielectric layers in numerous electronic devices and systems.

Capacitors, transistors, higher level ICs or devices including memory devices, and electronic systems are constructed utilizing the novel process for forming a dielectric film having an ultra thin equivalent oxide thickness, $t_{eq}$. Gate dielectric layers or films containing atomic layer deposited lanthanide oxide are formed having a dielectric constant ($\kappa$) substantially higher than that of silicon oxide, such that these dielectric films are capable of a $t_{eq}$ thinner than $SiO_2$ gate dielectrics of the same physical thickness. Alternately, the high dielectric constant relative to silicon dioxide allows the use of much larger physical thickness of these high-κ dielectric materials for the same $t_{eq}$ of $SiO_2$. Forming the relatively larger thickness aids in processing gate dielectrics and other dielectric layers in electronic devices and systems.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. An electronic device comprising:
  a dielectric layer in an integrated circuit, the dielectric layer being a multiple layer structure including:
    a lanthanum oxide layer;
    a metal oxide layer in which the metal oxide layer is without a lanthanide; and
    a lanthanide oxide layer, the lanthanide oxide layer being structured without lanthanum and having at least two different lanthanide oxides configured throughout the lanthanide oxide layer; and
  a ruthenium-based conductive layer contacting the lanthanum oxide layer.

2. The electronic device of claim 1, wherein the lanthanide oxide layer includes praseodymium oxide.

3. The electronic device of claim 1, wherein the electronic device includes a memory device.

4. The electronic device of claim 1, wherein the electronic device includes a transistor in the integrated circuit, the transistor having the dielectric layer as a gate insulator and the conductive layer as a gate in the transistor.

5. The electronic device of claim 1, wherein the electronic device includes a CMOS device in the integrated circuit, the CMOS device having the dielectric layer as a gate insulator and the conductive layer as a gate.

6. The electronic device of claim 1, wherein the electronic device includes a capacitor having the dielectric as a dielectric material between two electrodes in the capacitor, and the conductive layer as one of the two electrodes.

7. An electronic device comprising:
  a dielectric layer in an integrated circuit, the dielectric layer being a multiple layer structure including:
    a lanthanum oxide layer, the lanthanum oxide layer structured as a sequence of monolayers of the lanthanum oxide such that the lanthanum oxide layer has a surface with a structure defined by the sequence of monolayers of the lanthanum oxide;
    a metal oxide layer in which the metal oxide layer is without a lanthanide; and
    a lanthanide oxide layer, the lanthanide oxide layer having at least two different lanthanide oxides configured throughout the lanthanide oxide layer; and
  a conductive layer containing ruthenium contacting the dielectric layer.

8. The electronic device of claim 7, wherein the conductive layer is substantially a layer of ruthenium.

9. The electronic device of claim 7, wherein the conductive layer is substantially a layer of ruthenium oxide.

10. The electronic device of claim 7, wherein the electronic device includes a memory device having the dielectric layer as a gate insulator and the conductive layer as a gate in the memory device.

11. The electronic device of claim 10, wherein the gate insulator in the memory device is an inter-gate insulator in a flash memory device.

12. A system comprising:
  a controller; and
  an electronic device coupled to the controller, wherein the electronic device includes:
    a dielectric layer in an integrated circuit, the dielectric layer being a multiple layer structure including:
      a lanthanum oxide layer, the lanthanum oxide layer structured as a sequence of monolayers of the lanthanum oxide such that the lanthanum oxide layer has a surface with a structure defined by the sequence of monolayers of the lanthanum oxide;
      a metal oxide layer in which the metal oxide layer is without a lanthanide; and
      a lanthanide oxide layer, the lanthanide oxide layer having at least two different lanthanide oxides configured throughout the lanthanide oxide layer; and
    a conductive layer containing ruthenium contacting the dielectric layer.

13. The system of claim 12, wherein the conductive layer is substantially a layer of ruthenium.

14. The system of claim 12, wherein the conductive layer is substantially a layer of ruthenium oxide.

15. The system of claim 12, wherein the electronic device includes a memory.

16. The system of claim 12, wherein the lanthanide oxide layer includes a lanthanum oxide and another lanthanide oxide other than a lanthanum oxide.

17. A system comprising:
  a controller; and
  an electronic device coupled to the controller, the electronic device including:
    a dielectric layer in an integrated circuit, the dielectric layer being a multiple layer structure including:
      a lanthanum oxide layer;
      a metal oxide layer in which the metal oxide layer is without a lanthanide; and
      a lanthanide oxide layer, the lanthanide oxide layer being structured without lanthanum and having at least two different lanthanide oxides configured throughout the lanthanide oxide layer; and
    a ruthenium-based conductive layer contacting the lanthanum oxide layer.

18. The system of claim 17, wherein the electronic device includes a memory.

19. The system of claim 17, wherein the lanthanide oxide layer includes praseodymium oxide.

20. The system of claim 17, wherein the ruthenium-based conductive layer is substantially a layer of ruthenium oxide.

* * * * *